United States Patent
Brys et al.

(10) Patent No.: US 10,162,401 B1
(45) Date of Patent: Dec. 25, 2018

(54) MEASURING BATTERY DEGRADATION

(71) Applicant: Amazon Technologies, Inc., Seattle, WA (US)

(72) Inventors: Wieslaw Brys, Bedford, MA (US); Eric Bernard Jones, Somerville, MA (US); Richard Alan Goloski, Wakefield, MA (US); Kevin John Trenholme, Stow, MA (US)

(73) Assignee: Amazon Technologies, Inc., Seattle, WA (US)

( * ) Notice: Subject to any disclaimer, the term of this patent is extended or adjusted under 35 U.S.C. 154(b) by 394 days.

(21) Appl. No.: 14/869,678

(22) Filed: Sep. 29, 2015

(51) Int. Cl.
*G06F 1/32* (2006.01)
*G06F 1/26* (2006.01)

(52) U.S. Cl.
CPC ............ *G06F 1/3212* (2013.01); *G06F 1/266* (2013.01)

(58) Field of Classification Search
CPC .................................................... G06F 1/3212
USPC ........................................................ 324/427
See application file for complete search history.

(56) References Cited

U.S. PATENT DOCUMENTS

| | | | | |
|---|---|---|---|---|
| 6,498,454 B1 * | 12/2002 | Pinlam | ................ | B60L 11/1838 320/107 |
| 7,208,915 B2 * | 4/2007 | Kubota | ................ | H02J 7/0072 320/134 |
| 8,280,547 B2 | 10/2012 | D'Andrea et al. | | |
| 8,638,070 B2 * | 1/2014 | Maluf | ................... | H02J 7/0052 320/141 |
| 8,860,420 B2 * | 10/2014 | Rich | ..................... | H01M 10/48 324/426 |
| 9,087,314 B2 | 7/2015 | Hoffman et al. | | |
| 9,519,882 B2 * | 12/2016 | Galluzzo | ................. | B25J 5/007 |
| 2003/0225707 A1 * | 12/2003 | Ehrman | ................ | G06Q 10/08 705/64 |
| 2007/0293978 A1 * | 12/2007 | Wurman | ............ | G05B 19/4189 700/213 |
| 2013/0207618 A1 * | 8/2013 | Renken | ............... | H01M 10/425 320/155 |
| 2014/0214349 A1 * | 7/2014 | Dong | ................. | G01R 31/3651 702/63 |
| 2015/0357859 A1 * | 12/2015 | Pourdarvish | .......... | H01M 10/44 320/159 |

* cited by examiner

*Primary Examiner* — Richard Isla
*Assistant Examiner* — Jerry D Robbins
(74) *Attorney, Agent, or Firm* — Kilpatrick Townsend & Stockton LLP

(57) ABSTRACT

Approaches and related devices monitor the condition of a battery via voltage measurement during routine recharging instances. An approach includes supplying a charging current to the battery during each of a plurality of routine charging instances. The charging current is increased by a measured or predetermined amount during a current pulse portion of each of the routine charging instances. A resulting change in a battery voltage of the battery during the current pulse portion of each of the routine charging instances is measured. An impedance-indicative value of the battery is determined for each of the routine charging instances based on the change in the battery voltage during the current pulse portion. The impedance-indicative value is stored in a memory device for each of the routine charging instances. A condition of the battery is estimated based on one or more changes in the impedance-indicative values.

13 Claims, 11 Drawing Sheets

MEASURING BATTERY DEGRADATION

BACKGROUND

Rechargeable battery powered devices are ubiquitous and used in many applications where high reliability is desired. For example, some modern inventory systems employ battery-powered mobile drive units that transport inventory holders within an inventory facility. Each mobile drive unit typically includes a battery that is recharged repeatedly over time. Reliable operation of such an inventory system depends on reliable operation of the mobile drive units. Reliable operation of the mobile drive units depends on reliable functioning of the rechargeable battery of the mobile drive unit. Rechargeable batteries, however, typically degrade over time and, if not replaced in a timely fashion, may fail and thereby detrimentally impact the reliability of the respective device and/or system in which the rechargeable battery is employed.

BRIEF DESCRIPTION OF THE DRAWINGS

Various embodiments in accordance with the present disclosure will be described with reference to the drawings, in which.

DETAILED DESCRIPTION

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Approaches for monitoring the condition of a rechargeable battery are described in which measurement of battery impedance is integrated into recharging of the battery. In many embodiments, application of charging current to the battery includes an initial current pulse portion in which the charging current supplied to the battery is quickly ramped up from zero initial current to a target charging current. The increase in charging current supplied to the battery results in a corresponding increase in the battery voltage during recharging proportional to the magnitude of the charging current increase and the battery impedance. Over time, as the condition of the battery degrades, the impedance of the battery typically increases. By monitoring changes in the corresponding increase in battery voltage and/or the corresponding battery impedance over time, the condition of the battery can be estimated over time, and thereby provide data for determining when to replace the battery. In many embodiments, to account for temperature induced differences in battery impedance, the temperature of the battery is measured during the initial current pulse portion of the recharging instance and stored in memory along with the corresponding increase in battery voltage and/or the corresponding battery impedance. In many embodiments, the stored temperature data is used to identify a subset of the stored voltage increase values and/or impedance data that was obtained in a selected temperature range for analysis to monitor increase in the battery impedance over time to avoid consideration of variations in the stored voltage increase values and/or impedance data arising substantially from temperature variation alone or otherwise potentially affected by such changes in temperature.

Figure 1:
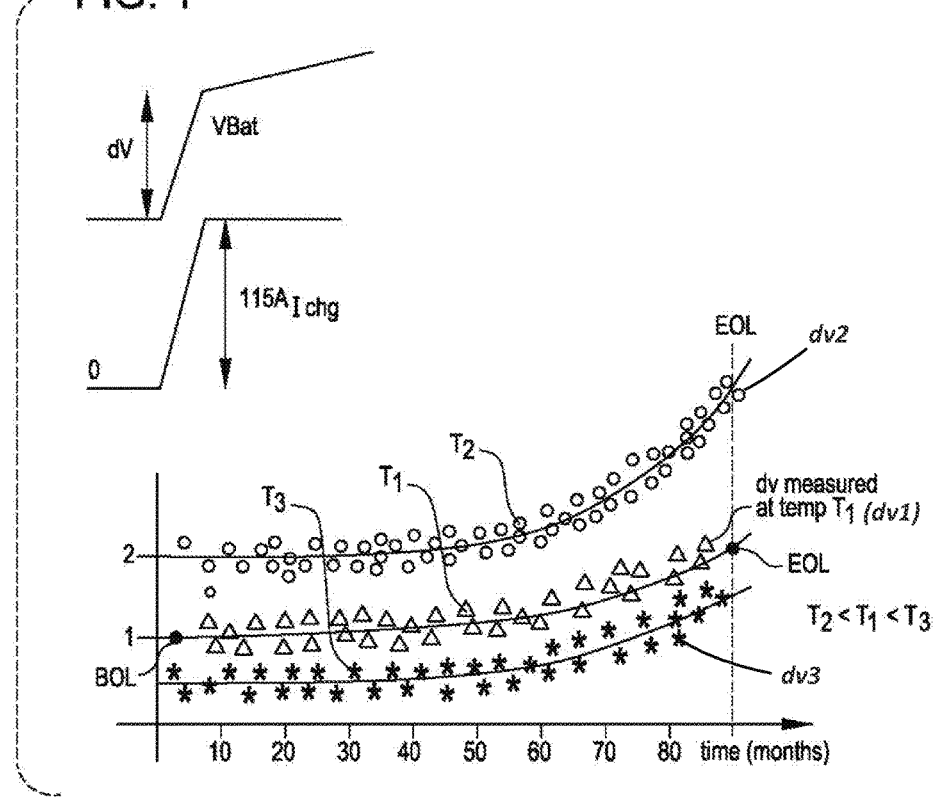
FIG. 1 illustrates monitoring the condition of a rechargeable battery over time via monitoring of increase in battery voltage during recharging, in accordance with many embodiments.

Turning now to the drawing figures in which like reference numbers refer to like elements in the various figures, FIG. 1 shows a plot of relative variation over time of voltage increase (dv) associated with the application of a charging current (Ichg). In the illustrated embodiment, the charging current (Ichg) increases from 0 A to 115 A at the start of each charging instance that occurs during the 90-month time frame of FIG. 1.

As depicted in FIG. 1, the measured voltage increase values (dv), and therefore the battery impedance, increases over time. The increased battery impedance over time is indicative of a corresponding battery degradation over time. A battery will typically degrade over time due to aging (calendar life) and due to physiochemical processes during battery operation. Degradation is also a function of the battery temperature. The processes involved in battery degradation are complex, interacting, often non-linear and difficult to describe in formulas. Existing methods for estimating battery condition typically involve a full charge and discharge cycle in well controlled conditions, generally requiring the use of specialized equipment. In contrast, in the approaches and related devices described herein, the battery impedance data and corresponding battery temperature data are obtained during regular battery recharging instances, thereby avoiding any dedicated battery testing that would otherwise increase the amount of time that the battery powered device cannot perform its normal or intended use.

In many embodiments, a voltage increase value (dv) and the temperature of the battery is measured and stored for each recharging instance. The temperature value can then be used during assessment of the voltage increase values (dv) values to account for temperature induced variations in battery impedance. For example, FIG. 1 shows voltage increase values ($dv_1$, $dv_2$, $dv_3$) taken when the battery temperature was approximately one of three different temperatures ($T_1$), ($T_2$), ($T_3$). Voltage increase values (dv) taken at temperatures other than about the three temperatures ($T_1$, $T_2$, and T) are not shown in FIG. 1 so as to more clearly illustrate the impact of battery temperature on battery impedance. Lower temperatures produce higher battery impedance and vice-versa. For the voltage increase values shown in FIG. 1, temperature ($T_2$) is lower than temperature ($T_1$), which is lower than temperature ($T_3$). Accordingly, the voltage increase values ($dv_2$) measured at temperature ($T_2$) are higher than the voltage increase values ($dv_1$). Likewise, the voltage increase values ($dv_1$) measured at temperature ($T_1$) are higher than the voltage increase values ($dv_3$) measured at temperature ($T_3$).

In many embodiments, the measured voltage increase values (dv) and the respective battery temperatures at which the voltage increase values (dv) are measured are stored into memory for subsequent recall and analysis to monitor variation in the measured voltage increase values (dv) over time so as to monitor degradation of the battery. The battery temperatures at which the voltage increase values (dv) were measured can be used in any suitable way to account for the temperature induced variation in the voltage increase values (dv). For example, the battery temperature values can be used to identify a subset of the voltage increase values (dv) that were measured at or about a particular temperature, for example, to identify the voltage increase values ($dv_1$) measured at or about temperature ($T_1$). The variation in time of the identified subset of the voltage increase values ($dv_1$) can then be assessed to identify variation in the impedance of the battery at the reference temperature ($T_1$) over time to determine when the voltage increase values ($dv_1$) exceed a suitable threshold. For example, at the beginning of life (BOL), the battery has a relative voltage increase value ($dv_1$) of about one. At about 90 months of use, the relative voltage increase value ($dv_1$) has increased to about two. In the illustration of FIG. 1, a voltage increase value ($dv_1$) of two corresponds to an end-of-life (EOL) threshold, thereby indicating that the battery has reached the end of its life and is ready to be replaced. Additionally or alternatively, a suitable rate of change in the voltage increase value ($dv_1$) can be selected as an alternative or additional EOL threshold.

As another example of a suitable use of the battery temperature data, a temperature corrected voltage increase value (dv_temp_corrected) can be calculated based on the measured voltage increase value (dv) and the battery temperature at which the voltage increase value (dv) was measured using any suitable method. For example, starting with an assumption that the battery impedance at or near a particular point in the life of the battery is a function of temperature, the voltage increase values and the respective temperatures at which they were measured at or near the particular point in the life of the battery can be used to determine a functional relationship between the voltage increase values and temperature using known curve-fitting techniques.

As an alternative to storing the voltage increase values (dv), the voltage increase value (dv) and the associated current increase (Ichg) can be used to calculate an impedance value for the battery and the impedance value and the temperature at which the voltage increase value is measured stored for subsequent assessment. Calculation and storage of battery impedance values can be used to account for variation in the associated current increase (Ichg) where the associated current increase (Ichg) differs between charging incidences. Where variation in the associated current increase (Ichg) is a possibility, the current increase (Ichg) can be measured for each charging instance and used along with the respective measured voltage increase value (dv) to calculate a battery impedance value so as to account for the possible variation in the current increase (Ichg).

Battery condition can be described in terms of battery capacity (e.g., measured in Ampere-hours [Ah]) and battery impedance (e.g., measured in Ohms [Ω]). Battery condition can also be described in terms of battery charge acceptance, which is functionally related to battery capacity and battery impedance. With battery capacity and battery impedance, it is possible to estimate battery condition without the need for a full charge/discharge cycle. And by using the approaches described herein for obtaining battery impedance data during recharging instances, substantially continual monitoring of battery condition during normal operation can be accomplished without the need for separate dedicated battery evaluation testing.

Estimation of battery condition can be enhanced using approaches described herein. For example, battery charging can be accomplished using a high initial current pulse. To enhance ease and accuracy of battery impedance measurement, the current charge pulses can increase at a fast rate and be of equal magnitude. When the battery is charged with such an initial current pulse, the battery voltage rises proportionally to the charging current and battery impedance. Accordingly, the measured battery voltage increase value is proportional to the value of battery internal impedance at the measured battery temperature. The battery temperature can be measured during the initial current pulse. The voltage increase values and the respective battery temperatures can be collected into a database, thereby enabling analysis of the battery impedance during the battery life, and allow the ability to determine the battery end-of-life (EOL) condition. Because battery impedance is strongly dependent on the battery temperature, the collection of battery temperature during the measurement of the voltage increase value enables analysis of the battery impedance in view of the respective temperatures at which the impedance measurements are taken.

Figure 2:
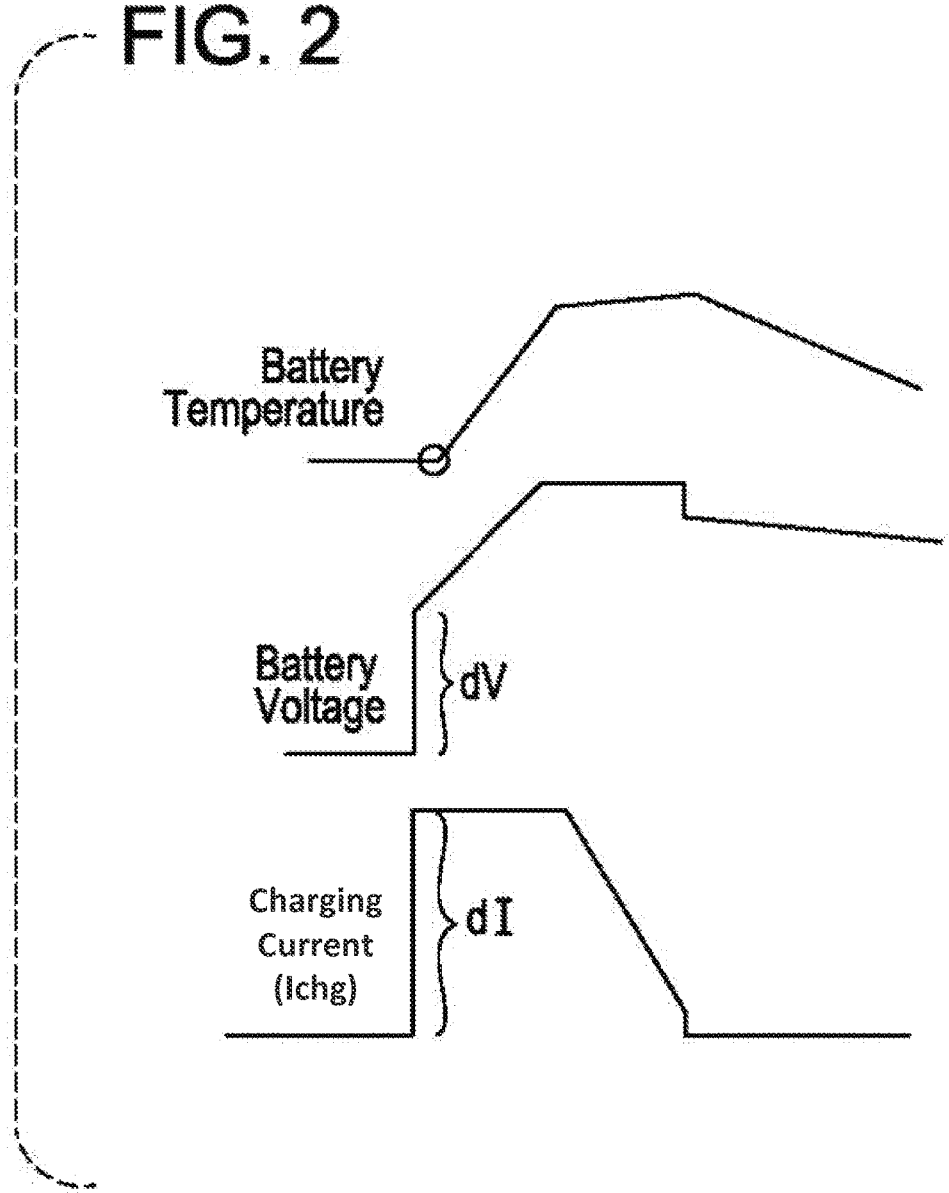
FIG. 2 illustrates example variations in charging current, increase in battery voltage during recharging, and battery temperature during a recharging instance, in accordance with many embodiments.

FIG. 2 illustrates an example variation in battery temperature during a charging instance. In the example charging instance, the charging current (Ichg) is ramped up from zero to a maximum charging current over a short initial period of time. The application of the charging current (Ichg) results in a respective battery voltage increase (dv) proportional to the charging current and the internal impedance of the battery. Once the charging instance begins, the battery temperature starts to increase from an initial value. By ramping the charging current from zero to the maximum charging current over a short initial period of time, the resulting change in temperature of the battery prior to the application of the maximum charging current can be reduced thereby minimizing error in battery impedance measurement caused by battery state of charge change and temperature change. Additionally, increasing a charging current from zero to a maximum charging current is typically part of routine battery charging instances accomplished with normal recharging equipment. To avoid voltage increase value variation resulting from temperature induced battery impedance changes, in many embodiments the battery temperature is measured at the start of the charging incidence at or about the same time as the voltage increase value is measured.

In many embodiments, the charging current (Ichg) is measured for each of the routine battery charging instances and used to exclude battery impedance measurements for recharging instances where the charging current (Ichg) is less than a predetermined magnitude. The accuracy of the battery impedance measurement may depend on the state of charge of the battery at the start of the routine charging instance. If the state of charge of the battery is relatively high, the resulting increase in charging current applied to the battery during the routine charging instance may be relatively small. For example, as shown in FIG. 2, the charging current drops off near the end of the routine charging instance where the battery is approaching a fully charged state. Accordingly, if the battery already has a close to full state of charge at the start of a routine charging of the battery, the increase in charging current will be relatively small and the resulting calculated battery impedance value will typically be less accurate due to noise. To filter out such less accurate battery impedance values, the measured charging current can be used as a filter to measure, store and/or analyze only those battery impedance values based on charging instances where the measured charging current is sufficiently large for the particular application (e.g., greater than 100 A in the described inventory management application). In general, a suitable minimum measured charging current can be selected for use as a filter based on battery type, battery capacity and/or potentially other characteristics of the particular battery and charging profile.

Battery Condition Monitoring in an Inventory Management System

Figure 3:
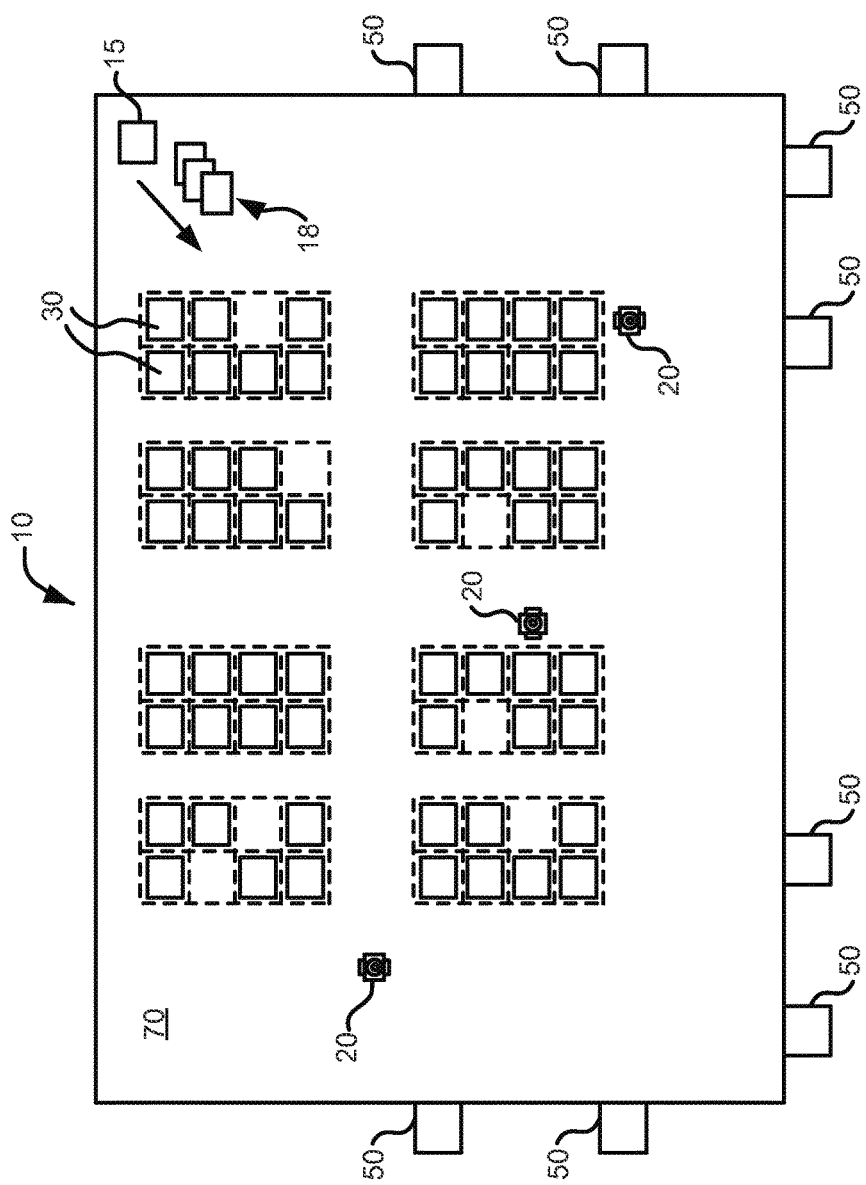
FIG. 3 illustrates components of an inventory system according to certain embodiments.

FIG. 3 illustrates components of an inventory system 10 that includes battery-powered mobile drive units with which the battery condition monitoring approaches described herein can be employed. The inventory system 10 includes a management module 15, one or more mobile drive units 20, one or more inventory holders 30, and one or more inventory stations 50. The mobile drive units 20 transport the inventory holders 30 between points within a workspace 70 in response to commands communicated by management module 15. Each of the inventory holders 30 is configured to store one or more types of inventory items. As a result, the inventory system 10 is capable of moving inventory items between locations within the workspace 70 to facilitate the entry, processing, and/or removal of inventory items to or from the inventory system 10 and the completion of other tasks involving inventory items.

The management module 15 assigns tasks to appropriate components of the inventory system 10 and coordinates operation of the various components in completing the tasks. These tasks may relate not only to the movement and processing of inventory items, but also to the management and maintenance of the components of inventory system 10. For example, the management module 15 may assign portions of the workspace 70 as parking spaces for the mobile drive units 20, the scheduled recharge or replacement of mobile drive unit batteries, the storage of empty inventory holders 30, or any other operations associated with the functionality supported by the inventory system 10 and its various components. The management module 15 may select components of the inventory system 10 to perform these tasks and communicate appropriate commands and/or data to the selected components to facilitate completion of these operations. Although shown in FIG. 3 as a single, discrete component, the management module 15 may represent multiple components and may represent or include portions of the mobile drive units 20 or other elements of the inventory system 10. As a result, any or all of the interaction between a particular mobile drive unit 20 and the management module 15 that is described below may, in particular embodiments, represent peer-to-peer communication between that mobile drive unit 20 and one or more other of the mobile drive units 20. The contents and operation of an example embodiment of the management module 15 are discussed further below with respect to FIG. 4.

The mobile drive units 20 move the inventory holders 30 between locations within the workspace 70. The mobile drive units 20 may represent any devices or components appropriate for use in the inventory system 10 based on the characteristics and configuration of the inventory holders 30 and/or other elements of the inventory system 10. In many embodiments of the inventory system 10 described herein, the mobile drive units 20 represent independent, self-powered devices configured to freely move about workspace 70. Examples of such inventory systems are disclosed in U.S. Patent Publication No. 2012/0143427, published on Jun. 7, 2012, titled "SYSTEM AND METHOD FOR POSITIONING A MOBILE DRIVE UNIT" and U.S. Pat. No. 8,280, 547, issued on Oct. 2, 2012, titled "METHOD AND SYSTEM FOR TRANSPORTING INVENTORY ITEMS", the entire disclosures of which are herein incorporated by reference. In alternative embodiments, the mobile drive units 20 represent elements of a tracked inventory system configured to move the inventory holders 30 along tracks, rails, cables, crane system, or other guidance or support elements traversing the workspace 70. In such an embodiment, the mobile drive units 20 may receive power and/or support through a connection to the guidance elements, such as a powered rail. Additionally, in particular embodiments of the inventory system 10, the mobile drive units 20 may be configured to utilize alternative conveyance equipment to move within the workspace 70 and/or between separate portions of the workspace 70. The contents and operation of an example embodiment of a mobile drive unit 20 are discussed further below with respect to FIGS. 5 and 6.

Additionally, the mobile drive units 20 may be capable of communicating with the management module 15 to receive information identifying selected inventory holders 30, transmit the locations of the mobile drive units 20, or exchange any other suitable information to be used by the management module 15 or the mobile drive units 20 during operation. The mobile drive units 20 may communicate with the management module 15 wirelessly, using wired connections between the mobile drive units 20 and the management module 15, and/or in any other appropriate manner. As one example, particular embodiments, the mobile drive unit 20 may communicate with the management module 15 and/or with one another using 802.11, Bluetooth, or Infrared Data Association (IrDA) standards, or any other appropriate wireless communication protocol. As another example, in a tracked inventory system 10, tracks or other guidance elements upon which the mobile drive units 20 move may be wired to facilitate communication between the mobile drive units 20 and other components of the inventory system 10. Furthermore, as noted above, the management module 15 may include components of individual mobile drive units 20. Thus, for the purposes of this description and the claims that follow, communication between the management module 15 and a particular mobile drive unit 20 may represent communication between components of a particular mobile drive unit 20. In general, the mobile drive units 20 may be powered, propelled, and controlled in any manner appropriate based on the configuration and characteristics of inventory system 10.

The inventory holders 30 store inventory items. In a particular embodiment, the inventory holders 30 include multiple storage bins with each storage bin capable of holding one or more types of inventory items. The inventory holders 30 are capable of being carried, rolled, and/or otherwise moved by the mobile drive units 20. In particular embodiments, the inventory holder 30 may provide additional propulsion to supplement that provided by the mobile drive unit 20 when moving the inventory holder 30.

Additionally, in particular embodiments, the inventory items 40 may also hang from hooks or bars (not shown) within or on the inventory holder 30. In general, the inventory holder 30 may store inventory items 40 in any appropriate manner within the inventory holder 30 and/or on the external surface of the inventory holder 30.

Additionally, each inventory holder 30 may include a plurality of faces, and each bin may be accessible through one or more faces of the inventory holder 30. For example, in a particular embodiment, the inventory holder 30 includes four faces. In such an embodiment, bins located at a corner of two faces may be accessible through either of those two faces, while each of the other bins is accessible through an opening in one of the four faces. The mobile drive unit 20 may be configured to rotate the inventory holder 30 at appropriate times to present a particular face and the bins associated with that face to an operator or other components of the inventory system 10.

Inventory items represent any objects suitable for storage, retrieval, and/or processing in the automated inventory system 10. For the purposes of this description, "inventory items" may represent any one or more objects of a particular type that are stored in the inventory system 10. Thus, a particular inventory holder 30 is currently "storing" a particular inventory item if the inventory holder 30 currently holds one or more units of that type. As one example, the inventory system 10 may represent a mail order warehouse facility, and inventory items may represent merchandise stored in the warehouse facility. During operation, the mobile drive units 20 may retrieve inventory holders 30 containing one or more inventory items requested in an order to be packed for delivery to a customer or inventory holders 30 carrying pallets containing aggregated collections of inventory items for shipment. Moreover, in particular embodiments of the inventory system 10, boxes containing completed orders may themselves represent inventory items.

In particular embodiments, the inventory system 10 may also include one or more inventory stations 50. The inventory stations 50 represent locations designated for the completion of particular tasks involving inventory items. Such tasks may include the removal of inventory items from the inventory holders 30, the introduction of inventory items into the inventory holders 30, the counting of inventory items in the inventory holders 30, the decomposition of inventory items (e.g., from pallet-sized or case-sized groups to individual inventory items), the consolidation of inventory items between the inventory holders 30, and/or the processing or handling of inventory items in any other suitable manner. In particular embodiments, the inventory stations 50 may just represent the physical locations where a particular task involving inventory items can be completed within the workspace 70. In alternative embodiments, the inventory stations 50 may represent both the physical location and also any appropriate equipment for processing or handling inventory items, such as scanners for monitoring the flow of inventory items in and out of the inventory system 10, communication interfaces for communicating with the management module 15, and/or any other suitable components. The inventory stations 50 may be controlled, entirely or in part, by human operators or may be fully automated. Moreover, the human or automated operators of the inventory stations 50 may be capable of performing certain tasks to inventory items, such as packing, counting, or transferring inventory items, as part of the operation of the inventory system 10.

The workspace 70 represents an area associated with the inventory system 10 in which the mobile drive units 20 can move and/or the inventory holders 30 can be stored. For example, the workspace 70 may represent all or part of the floor of a mail-order warehouse in which the inventory system 10 operates. Although FIG. 3 shows, for the purposes of illustration, an embodiment of the inventory system 10 in which the workspace 70 includes a fixed, predetermined, and finite physical space, particular embodiments of the inventory system 10 may include mobile drive units 20 and inventory holders 30 that are configured to operate within a workspace 70 that is of variable dimensions and/or an arbitrary geometry. While FIG. 3 illustrates a particular embodiment of the inventory system 10 in which the workspace 70 is entirely enclosed in a building, alternative embodiments may utilize workspaces 70 in which some or all of the workspace 70 is located outdoors, within a vehicle (such as a cargo ship), or otherwise unconstrained by any fixed structure.

In operation, the management module 15 selects appropriate components to complete particular tasks and transmits task assignments 18 to the selected components to trigger completion of the relevant tasks. Each task assignment 18 defines one or more tasks to be completed by a particular component. These tasks may relate to the retrieval, storage, replenishment, and counting of inventory items and/or the management of the mobile drive units 20, the inventory holders 30, the inventory stations 50 and other components of the inventory system 10. Depending on the component and the task to be completed, a particular task assignment 18 may identify locations, components, and/or actions associated with the corresponding task and/or any other appropriate information to be used by the relevant component in completing the assigned task.

In particular embodiments, the management module 15 generates the task assignments 18 based, in part, on inventory requests that the management module 15 receives from other components of the inventory system 10 and/or from external components in communication with the management module 15. These inventory requests identify particular operations to be completed involving inventory items stored or to be stored within the inventory system 10 and may represent communication of any suitable form. For example, in particular embodiments, an inventory request may represent a shipping order specifying particular inventory items that have been purchased by a customer and that are to be retrieved from the inventory system 10 for shipment to the customer. The management module 15 may also generate the task assignments 18 independently of such inventory requests, as part of the overall management and maintenance of the inventory system 10. For example, the management module 15 may generate the task assignments 18 in response to the occurrence of a particular event (e.g., in response to a mobile drive unit 20 requesting a space to park), according to a predetermined schedule (e.g., as part of a daily start-up routine), or at any appropriate time based on the configuration and characteristics of the inventory system 10. After generating one or more task assignments 18, the management module 15 transmits the generated task assignments 18 to appropriate components for completion of the corresponding task. The relevant components then execute their assigned tasks.

With respect to the mobile drive units 20 specifically, the management module 15 may, in particular embodiments, communicate task assignments 18 to selected mobile drive units 20 that identify one or more destinations for the selected mobile drive units 20. The management module 15 may select a mobile drive unit 20 to assign the relevant task based on the location or state of the selected mobile drive unit 20, an indication that the selected mobile drive unit 20 has completed a previously-assigned task, a predetermined schedule, and/or any other suitable consideration. These destinations may be associated with an inventory request the management module 15 is executing or a management objective the management module 15 is attempting to fulfill. For example, the task assignment may define the location of an inventory holder 30 to be retrieved, an inventory station 50 to be visited, a storage location where the mobile drive unit 20 should park until receiving another task, or a location associated with any other task appropriate based on the configuration, characteristics, and/or state of the inventory system 10, as a whole, or individual components of the inventory system 10. For example, in particular embodiments, such decisions may be based on the popularity of particular inventory items, the staffing of a particular inventory station 50, the tasks currently assigned to a particular mobile drive unit 20, and/or any other appropriate considerations.

As part of completing these tasks the mobile drive units 20 may dock with and transport inventory holders 30 within workspace 70. The mobile drive units 20 may dock with the inventory holders 30 by connecting to, lifting, and/or otherwise interacting with inventory holders 30 in any other suitable manner so that, when docked, the mobile drive units 20 are coupled to and/or support the inventory holders 30 and can move the inventory holders 30 within the workspace 70. While the description below focuses on particular embodiments of the mobile drive unit 20 and the inventory holder 30 that are configured to dock in a particular manner, alternative embodiments of the mobile drive unit 20 and the inventory holder 30 may be configured to dock in any manner suitable to allow the mobile drive unit 20 to move the inventory holder 30 within the workspace 70. Additionally, as noted below, in particular embodiments, the mobile drive units 20 represent all or portions of the inventory holders 30. In such embodiments, the mobile drive units 20 may not dock with the inventory holders 30 before transporting the inventory holders 30 and/or the mobile drive units 20 may each remain continually docked with a particular inventory holder 30.

While the appropriate components of the inventory system 10 complete assigned tasks, the management module 15 may interact with the relevant components to ensure the efficient use of space, equipment, manpower, and other resources available to the inventory system 10. As one specific example of such interaction, the management module 15 is responsible, in particular embodiments, for planning the paths the mobile drive units 20 take when moving within the workspace 70 and for allocating use of a particular portion of the workspace 70 to a particular mobile drive unit 20 for purposes of completing an assigned task. In such embodiments, the mobile drive units 20 may, in response to being assigned a task, request a path to a particular destination associated with the task. Moreover, while the description below focuses on one or more embodiments in which the mobile drive unit 20 requests paths from the management module 15, the mobile drive unit 20 may, in alternative embodiments, generate its own paths.

Components of the inventory system 10 may provide information to the management module 15 regarding their current state, other components of the inventory system 10 with which they are interacting, and/or other conditions relevant to the operation of the inventory system 10. This may allow the management module 15 to utilize feedback from the relevant components to update algorithm parameters, adjust policies, or otherwise modify its decision-making to respond to changes in operating conditions or the occurrence of particular events.

In addition, while the management module 15 may be configured to manage various aspects of the operation of the components of the inventory system 10, in particular embodiments, the components themselves may also be responsible for decision-making relating to certain aspects of their operation, thereby reducing the processing load on the management module 15.

Thus, based on its knowledge of the location, current state, and/or other characteristics of the various components of the inventory system 10 and an awareness of all the tasks currently being completed, the management module 15 can generate tasks, allot usage of system resources, and otherwise direct the completion of tasks by the individual components in a manner that optimizes operation from a system-wide perspective. Moreover, by relying on a combination of both centralized, system-wide management and localized, component-specific decision-making, particular embodiments of the inventory system 10 may be able to support a number of techniques for efficiently executing various aspects of the operation of the inventory system 10. As a result, particular embodiments of the management module 15 may, by implementing one or more management techniques described below, enhance the efficiency of the inventory system 10 and/or provide other operational benefits.

Figure 4:
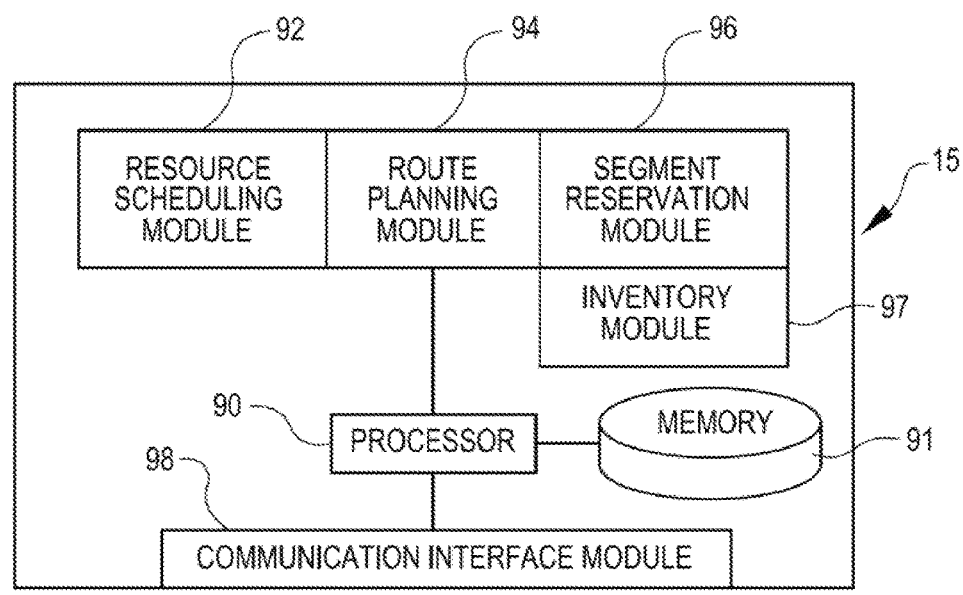
FIG. 4 illustrates in greater detail the components of an example management module that may be utilized in particular embodiments of the inventory system shown in FIG. 3.

FIG. 4 illustrates in greater detail the components of a particular embodiment of the management module 15. As shown, the example embodiment includes a resource scheduling module 92, a route planning module 94, a segment reservation module 96, an inventory module 97, a communication interface module 98, a processor 90, and a memory 91. The management module 15 may represent a single component, multiple components located at a central location within the inventory system 10, or multiple components distributed throughout the inventory system 10. For example, the management module 15 may represent components of one or more of the mobile drive units 20 that are capable of communicating information between the mobile drive units 20 and coordinating the movement of the mobile drive units 20 within the workspace 70. In general, the management module 15 may include any appropriate combination of hardware and/or software suitable to provide the described functionality.

The processor 90 is operable to execute instructions associated with the functionality provided by the management module 15. The processor 90 may comprise one or more general purpose computers, dedicated microprocessors, or other processing devices capable of communicating electronic information. Examples of the processor 90 include one or more application-specific integrated circuits (ASICs), field programmable gate arrays (FPGAs), digital signal processors (DSPs) and any other suitable specific or general purpose processors.

The memory 91 stores processor instructions, inventory requests, reservation information, state information for the various components of the inventory system 10 and/or any other appropriate values, parameters, or information utilized by the management module 15 during operation. The memory 91 may represent any collection and arrangement of volatile or nonvolatile, local or remote devices suitable for storing data. Examples of the memory 91 include, but are not limited to, random access memory (RAM) devices, read only memory (ROM) devices, magnetic storage devices, optical storage devices or any other suitable data storage devices.

The resource scheduling module 92 processes received inventory requests and generates one or more assigned tasks to be completed by the components of the inventory system 10. The resource scheduling module 92 may also select one or more appropriate components for completing the assigned tasks and, using the communication interface module 98, communicate the assigned tasks to the relevant components. Additionally, the resource scheduling module 92 may also be responsible for generating assigned tasks associated with various management operations, such as prompting the mobile drive units 20 to recharge batteries or have batteries replaced, instructing inactive mobile drive units 20 to park in a location outside the anticipated traffic flow or a location near the anticipated site of future tasks, and/or directing the mobile drive units 20 selected for repair or maintenance to move towards a designated maintenance station.

The route planning module 94 receives route requests from the mobile drive units 20. These route requests identify one or more destinations associated with a task the requesting mobile drive unit 20 is executing. In response to receiving a route request, the route planning module 94 generates a path to one or more destinations identified in the route request. The route planning module 94 may implement any appropriate algorithms utilizing any appropriate parameters, factors, and/or considerations to determine the appropriate path. After generating an appropriate path, the route planning module 94 transmits a route response identifying the generated path to the requesting mobile drive unit 20 using the communication interface module 98.

The segment reservation module 96 receives reservation requests from the mobile drive units 20 attempting to move along paths generated by the route planning module 94. These reservation requests request the use of a particular portion of the workspace 70 (referred to herein as a "segment") to allow the requesting mobile drive unit 20 to avoid collisions with other mobile drive units 20 while moving across the reserved segment. In response to received reservation requests, the segment reservation module 96 transmits a reservation response granting or denying the reservation request to the requesting mobile drive unit 20 using the communication interface module 98.

The inventory module 97 maintains information about the location and number of inventory items 40 in the inventory system 10. Information can be maintained about the number of inventory items 40 in a particular inventory holder 30, and the maintained information can include the location of those inventory items 40 in the inventory holder 30. The inventory module 97 can also communicate with the mobile drive units 20, utilizing task assignments 18 to maintain, replenish or move inventory items 40 within the inventory system 10.

The communication interface module 98 facilitates communication between the management module 15 and other components of the inventory system 10, including reservation responses, reservation requests, route requests, route responses, and task assignments. These reservation responses, reservation requests, route requests, route responses, and task assignments may represent communication of any form appropriate based on the capabilities of the management module 15 and may include any suitable information. Depending on the configuration of the management module 15, the communication interface module 98 may be responsible for facilitating either or both of wired and wireless communication between the management module 15 and the various components of the inventory system 10. In particular embodiments, the management module 15 may communicate using communication protocols such as 802.11, Bluetooth, or Infrared Data Association (IrDA) standards. Furthermore, the management module 15 may, in particular embodiments, represent a portion of mobile drive unit 20 or other components of the inventory system 10. In such embodiments, the communication interface module 98 may facilitate communication between the management module 15 and other parts of the same system component.

In general, the resource scheduling module 92, the route planning module 94, the segment reservation module 96, the inventory module 97, and the communication interface module 98 may each represent any appropriate hardware and/or software suitable to provide the described functionality. In addition, as noted above, the management module 15 may, in particular embodiments, represent multiple different discrete components and any or all of the resource scheduling module 92, the route planning module 94, the segment reservation module 96, the inventory module 97, and the communication interface module 98 may represent components physically separate from the remaining elements of the management module 15. Moreover, any two or more of the resource scheduling module 92, the route planning module 94, the segment reservation module 96, the inventory module 97, and the communication interface module 98 may share common components. For example, in particular embodiments, the resource scheduling module 92, the route planning module 94, the segment reservation module 96, and the inventory module 97 represent computer processes executing on the processor 90 and the communication interface module 98 comprises a wireless transmitter, a wireless receiver, and a related computer process executing on the processor 90.

Figure 5:
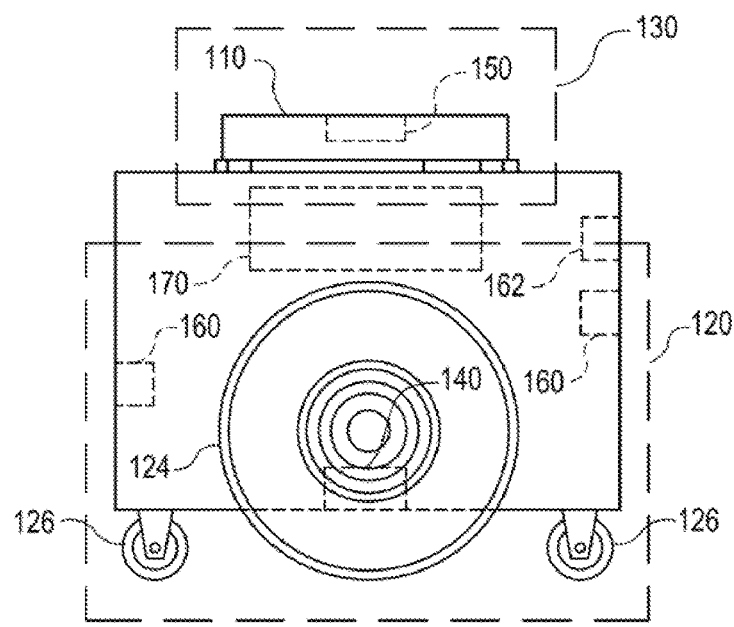
FIGS. 5 and 6 illustrate in greater detail an example of a mobile drive unit that may be utilized in particular embodiments of the inventory system shown in FIG. 3.
Figure 6:
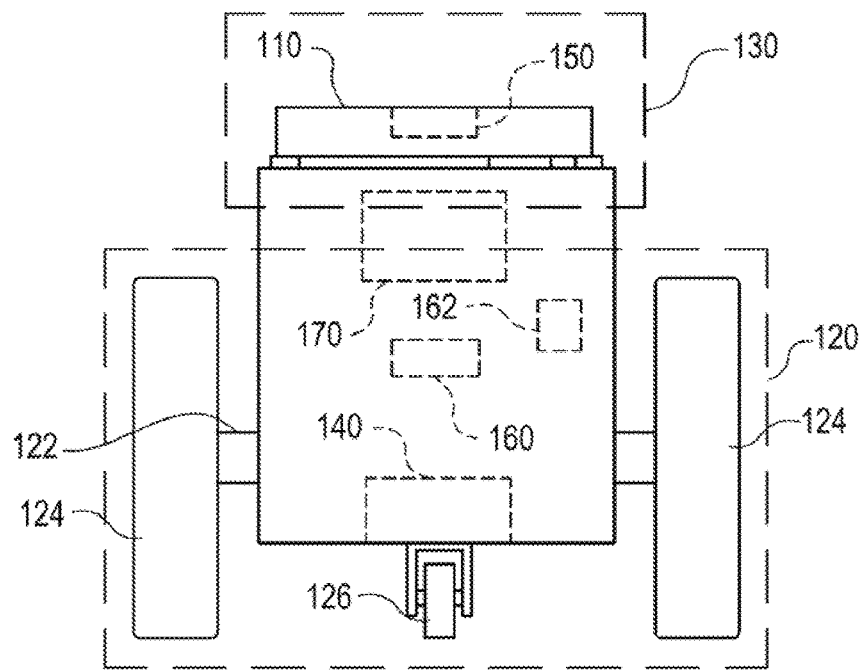

FIGS. 5 and 6 illustrate in greater detail the components of a particular embodiment of the mobile drive unit 20. In particular, FIGS. 5 and 6 include a front and side view of an example mobile drive unit 20. The mobile drive unit 20 includes a docking head 110, a drive module 120, a docking actuator 130, and a control module 170. Additionally, the mobile drive unit 20 may include one or more sensors configured to detect or determine the location of the mobile drive unit 20, the inventory holder 30, and/or other appropriate elements of the inventory system 10. In the illustrated embodiment, the mobile drive unit 20 includes a position sensor 140, a holder sensor 150, an obstacle sensor 160, and an identification signal transmitter 162.

The docking head 110, in particular embodiments of the mobile drive unit 20, couples the mobile drive unit 20 to the inventory holder 30 and/or supports the inventory holder 30 when the mobile drive unit 20 is docked to the inventory holder 30. The docking head 110 may additionally allow the mobile drive unit 20 to maneuver the inventory holder 30, such as by lifting the inventory holder 30, propelling the inventory holder 30, rotating the inventory holder 30, and/or moving the inventory holder 30 in any other appropriate manner. The docking head 110 may also include any appropriate combination of components, such as ribs, spikes, and/or corrugations, to facilitate such manipulation of the inventory holder 30. For example, in particular embodiments, the docking head 110 may include a high-friction portion that abuts a portion of the inventory holder 30 while the mobile drive unit 20 is docked to the inventory holder 30. In such embodiments, frictional forces created between the high-friction portion of the docking head 110 and a surface of the inventory holder 30 may induce translational and rotational movement in the inventory holder 30 when the docking head 110 moves and rotates, respectively. As a result, the mobile drive unit 20 may be able to manipulate the inventory holder 30 by moving or rotating the docking head 110, either independently or as a part of the movement of the mobile drive unit 20 as a whole.

The drive module 120 propels the mobile drive unit 20 and, when the mobile drive unit 20 and the inventory holder 30 are docked, the inventory holder 30. The drive module 120 may represent any appropriate collection of components operable to propel the mobile drive unit 20. For example, in the illustrated embodiment, the drive module 120 includes a motorized axle 122, a pair of motorized wheels 124, and a pair of stabilizing wheels 126. One motorized wheel 124 is located at each end of the motorized axle 122. One stabilizing wheel 126 is positioned at each end of the mobile drive unit 20.

The docking actuator 130 moves the docking head 110 towards the inventory holder 30 to facilitate docking of the mobile drive unit 20 and the inventory holder 30. The docking actuator 130 may also be capable of adjusting the position or orientation of the docking head 110 in other suitable manners to facilitate docking. The docking actuator 130 may include any appropriate components, based on the configuration of the mobile drive unit 20 and the inventory holder 30, for moving the docking head 110 or otherwise adjusting the position or orientation of the docking head 110. For example, in the illustrated embodiment, the docking actuator 130 includes a motorized shaft (not shown) attached to the center of the docking head 110. The motorized shaft is operable to lift the docking head 110 as appropriate for docking with the inventory holder 30.

The drive module 120 may be configured to propel the mobile drive unit 20 in any appropriate manner. For example, in the illustrated embodiment, the motorized wheels 124 are operable to rotate in a first direction to propel the mobile drive unit 20 in a forward direction. The motorized wheels 124 are also operable to rotate in a second direction to propel the mobile drive unit 20 in a backward direction. In the illustrated embodiment, the drive module 120 is also configured to rotate the mobile drive unit 20 by rotating the motorized wheels 124 in different directions from one another or by rotating the motorized wheels 124 at different speeds from one another.

The position sensor 140 represents one or more sensors, detectors, or other components suitable for determining the location of the mobile drive unit 20 in any appropriate manner. For example, in particular embodiments, the workspace 70 associated with the inventory system 10 includes a number of fiducial marks that mark points on a two-dimensional grid that covers all or a portion of the workspace 70. In such embodiments, the position sensor 140 may include a camera and suitable image- and/or video-processing components, such as an appropriately-programmed digital signal processor, to allow the position sensor 140 to detect fiducial marks within the camera's field of view. The control module 170 may store location information that the position sensor 140 updates as the position sensor 140 detects fiducial marks. As a result, the position sensor 140 may utilize fiducial marks to maintain an accurate indication of the location of the mobile drive unit 20 and to aid in navigation when moving within the workspace 70.

The holder sensor 150 represents one or more sensors, detectors, or other components suitable for detecting the inventory holder 30 and/or determining, in any appropriate manner, the location of the inventory holder 30, as an absolute location or as a position relative to the mobile drive unit 20. The holder sensor 150 may be capable of detecting the location of a particular portion of the inventory holder 30 or the inventory holder 30 as a whole. The mobile drive unit 20 may then use the detected information for docking with or otherwise interacting with the inventory holder 30.

The obstacle sensor 160 represents one or more sensors capable of detecting objects located in one or more different directions in which the mobile drive unit 20 is capable of moving. The obstacle sensor 160 may utilize any appropriate components and techniques, including optical, radar, sonar, pressure-sensing and/or other types of detection devices appropriate to detect objects located in the direction of travel of the mobile drive unit 20. In particular embodiments, the obstacle sensor 160 may transmit information describing objects it detects to the control module 170 to be used by the control module 170 to identify obstacles and to take appropriate remedial actions to prevent the mobile drive unit 20 from colliding with obstacles and/or other objects.

The obstacle sensor 160 may also detect signals transmitted by other mobile drive units 20 operating in the vicinity of the illustrated mobile drive unit 20. For example, in particular embodiments of the inventory system 10, one or more mobile drive units 20 may include an identification signal transmitter 162 that transmits a drive identification signal. The drive identification signal indicates to other mobile drive units 20 that the object transmitting the drive identification signal is in fact a mobile drive unit. The identification signal transmitter 162 may be capable of transmitting infrared, ultraviolet, audio, visible light, radio, and/or other suitable signals that indicate to recipients that the transmitting device is a mobile drive unit 20.

Additionally, in particular embodiments, the obstacle sensor 160 may also be capable of detecting state information transmitted by other mobile drive units 20. For example, in particular embodiments, the identification signal transmitter 162 may be capable of including state information relating to the mobile drive unit 20 in the transmitted identification signal. This state information may include, but is not limited to, the position, velocity, direction, and the braking capabilities of the transmitting mobile drive unit 20. In particular embodiments, the mobile drive unit 20 may use the state information transmitted by other mobile drive units to avoid collisions when operating in close proximity with those other mobile drive units.

The control module 170 monitors and/or controls operation of the drive module 120 and the docking actuator 130. The control module 170 may also receive information from sensors such as the position sensor 140 and the holder sensor 150 and adjust the operation of the drive module 120, the docking actuator 130, and/or other components of the mobile drive unit 20 based on this information. Additionally, in particular embodiments, the mobile drive unit 20 may be configured to communicate with a management device of the inventory system 10 and the control module 170 may receive commands transmitted to the mobile drive unit 20 and communicate information back to the management device utilizing appropriate communication components of the mobile drive unit 20. The control module 170 may include any appropriate hardware and/or software suitable to provide the described functionality. In particular embodiments, the control module 170 includes a general-purpose microprocessor programmed to provide the described functionality. Additionally, the control module 170 may include all or portions of the docking actuator 130, the drive module 120, the position sensor 140, and/or the holder sensor 150, and/or share components with any of these elements of the mobile drive unit 20.

Moreover, in particular embodiments, the control module 170 may include hardware and software located in components that are physically distinct from the device that houses the drive module 120, the docking actuator 130, and/or the other components of the mobile drive unit 20 described above. For example, in particular embodiments, each mobile drive unit 20 operating in the inventory system 10 may be associated with a software process (referred to here as a "drive agent") operating on a server that is in communication with the device that houses the drive module 120, the docking actuator 130, and other appropriate components of the mobile drive unit 20. This drive agent may be responsible for requesting and receiving tasks, requesting and receiving routes, transmitting state information associated with the mobile drive unit 20, and/or otherwise interacting with the management module 15 and other components of the inventory system 10 on behalf of the device that physically houses the drive module 120, the docking actuator 130, and the other appropriate components of the mobile drive unit 20. As a result, for the purposes of this description and the claims that follow, the term "mobile drive unit" includes software and/or hardware, such as agent processes, that provides the described functionality on behalf of the mobile drive unit 20 but that may be located in physically distinct devices from the drive module 120, the docking actuator 130, and/or the other components of the mobile drive unit 20 described above.

While FIGS. 5 and 6 illustrate a particular embodiment of the mobile drive unit 20 containing certain components and configured to operate in a particular manner, the mobile drive unit 20 may represent any appropriate component and/or collection of components configured to transport and/or facilitate the transport of the inventory holders 30. As another example, the mobile drive unit 20 may represent part of an overhead crane system in which one or more crane assemblies are capable of moving within a network of wires or rails to a position suitable to dock with a particular inventory holder 30. After docking with the inventory holder 30, the crane assembly may then lift the inventory holder 30 and move the inventory holder 30 to another location for purposes of completing an assigned task.

Furthermore, in particular embodiments, the mobile drive unit 20 may represent all or a portion of the inventory holder 30. The inventory holder 30 may include motorized wheels or any other components suitable to allow the inventory holder 30 to propel itself. As one specific example, a portion of the inventory holder 30 may be responsive to magnetic fields. The inventory system 10 may be able to generate one or more controlled magnetic fields capable of propelling, maneuvering and/or otherwise controlling the position of the inventory holder 30 as a result of the responsive portion of the inventory holder 30. In such embodiments, the mobile drive unit 20 may represent the responsive portion of the inventory holder 30 and/or the components of the inventory system 10 responsible for generating and controlling these magnetic fields. While this description provides several specific examples, the mobile drive unit 20 may, in general, represent any appropriate component and/or collection of components configured to transport and/or facilitate the transport of the inventory holders 30.

Figure 7:
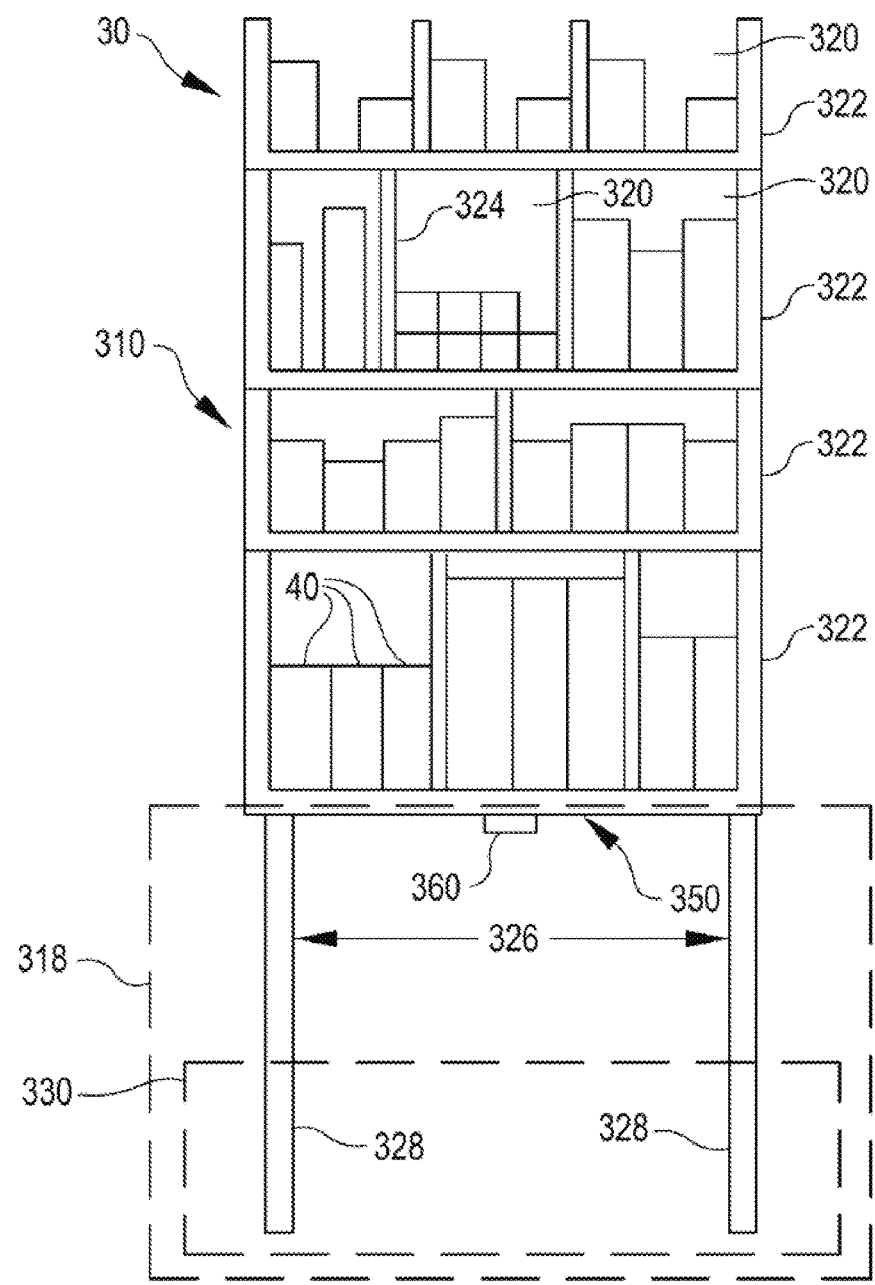
FIG. 7 illustrates in greater detail an example inventory holder that may be utilized in particular embodiments of the inventory system shown in FIG. 3.

FIG. 7 illustrates in greater detail the components of a particular embodiment of the inventory holder 30. In particular, FIG. 7 illustrates the structure and contents of one side of an example inventory holder 30. In a particular embodiment, the inventory holder 30 may comprise any number of faces with similar or different structure. As illustrated, the inventory holder 30 includes a frame 310, a plurality of legs 328, and a docking surface 350.

The frame 310 holds inventory items 40. The frame 310 provides storage space for storing the inventory items 40 external or internal to the frame 310. The storage space provided by the frame 310 may be divided into a plurality of inventory bins 320, each capable of holding inventory items 40. The inventory bins 320 may include any appropriate storage elements, such as bins, compartments, or hooks.

In a particular embodiment, the frame 310 is composed of a plurality of trays 322 stacked upon one another and attached to or stacked on a base 318. In such an embodiment, the inventory bins 320 may be formed by a plurality of adjustable dividers 324 that may be moved to resize one or more of the inventory bins 320. In alternative embodiments, the frame 310 may represent a single inventory bin 320 that includes a single tray 322 and no adjustable dividers 324. Additionally, in particular embodiments, the frame 310 may represent a load-bearing surface mounted on a mobility element 330. The inventory items 40 may be stored on such an inventory holder 30 by being placed on the frame 310. In general, the frame 310 may include internal and/or external storage space divided into any appropriate number of inventory bins 320 in any appropriate manner.

Additionally, in a particular embodiment, the frame 310 may include a plurality of device openings 326 that allow the mobile drive unit 20 to position the docking head 110 adjacent the docking surface 350. The size, shape, and placement of the device openings 326 may be determined based on the size, the shape, and other characteristics of the particular embodiment of the mobile drive unit 20 and/or the inventory holder 30 utilized by the inventory system 10. For example, in the illustrated embodiment, the frame 310 includes four legs 328 that form device openings 326 and allow the mobile drive unit 20 to move to under the frame 310 and adjacent to the docking surface 350. The length of the legs 328 may be determined based on a height of the mobile drive unit 20.

The docking surface 350 comprises a portion of the inventory holder 30 that couples to, abuts, and/or rests upon a portion of the docking head 110, when the mobile drive unit 20 is docked to the inventory holder 30. Additionally, the docking surface 350 supports a portion or all of the weight of the inventory holder 30 while the inventory holder 30 is docked with the mobile drive unit 20. The composition, shape, and/or texture of the docking surface 350 may be designed to facilitate maneuvering of the inventory holder 30 by the mobile drive unit 20. For example, as noted above, in particular embodiments, the docking surface 350 may comprise a high-friction portion. When the mobile drive unit 20 and the inventory holder 30 are docked, frictional forces induced between the docking head 110 and this high-friction portion may allow the mobile drive unit 20 to maneuver the inventory holder 30. Additionally, in particular embodiments, the docking surface 350 may include appropriate components suitable to receive a portion of the docking head 110, couple the inventory holder 30 to the mobile drive unit 20, and/or facilitate control of the inventory holder 30 by the mobile drive unit 20.

A holder identifier 360 marks a predetermined portion of the inventory holder 30 and the mobile drive unit 20 may use the holder identifier 360 to align with the inventory holder 30 during docking and/or to determine the location of the inventory holder 30. More specifically, in particular embodiments, the mobile drive unit 20 may be equipped with components, such as the holder sensor 150, that can detect the holder identifier 360 and determine its location relative to the mobile drive unit 20. As a result, the mobile drive unit 20 may be able to determine the location of the inventory holder 30 as a whole. For example, in particular embodiments, the holder identifier 360 may represent a reflective marker that is positioned at a predetermined location on the inventory holder 30 and that the holder sensor 150 can optically detect using an appropriately-configured camera.

Depending on the configuration and characteristics of the mobile drive unit 20 and the inventory system 10, the mobile drive unit 20 may move the inventory holder 30 using a variety of appropriate methods. In a particular embodiment, the mobile drive unit 20 is capable of moving the inventory holder 30 along a two-dimensional grid, combining movement along straight-line segments with ninety-degree rotations and arcing paths to transport the inventory holder 30 from the first location to the second location. Additionally, while moving, the mobile drive unit 20 may use fixed objects located in the workspace as reference points to assist in navigation. For example, in particular embodiments, the inventory system 10 includes multiple fiducial marks. The mobile drive unit 20 may be configured to detect fiducial marks and to determine the location of the mobile drive unit 20 and/or measure its movement based on the detection of fiducial marks.

After the mobile drive unit 20 arrives at the second location, the mobile drive unit 20 may perform appropriate operations to facilitate access to the inventory items 40 stored in the inventory holder 30. For example, the mobile drive unit 20 may rotate the inventory holder 30 to present a particular face of the inventory holder 30 to an operator of the inventory system 10 or other suitable party, such as a packer selecting inventory items 40 from the inventory holder 30. The mobile drive unit 20 may also undock from the inventory holder 30. Alternatively, instead of undocking at the second location, the mobile drive unit 20 may transport the inventory holder 30 back to the first location or to a third location after any appropriate actions have been taken involving the inventory items 40. For example, after a packer has removed particular inventory items 40 from the inventory holder 30, the mobile drive unit 20 may return the inventory holder 30 to its original storage location, a new storage location, or another inventory station. The mobile drive unit 20 may then undock from the inventory holder 30 at this new location.

Figure 8:
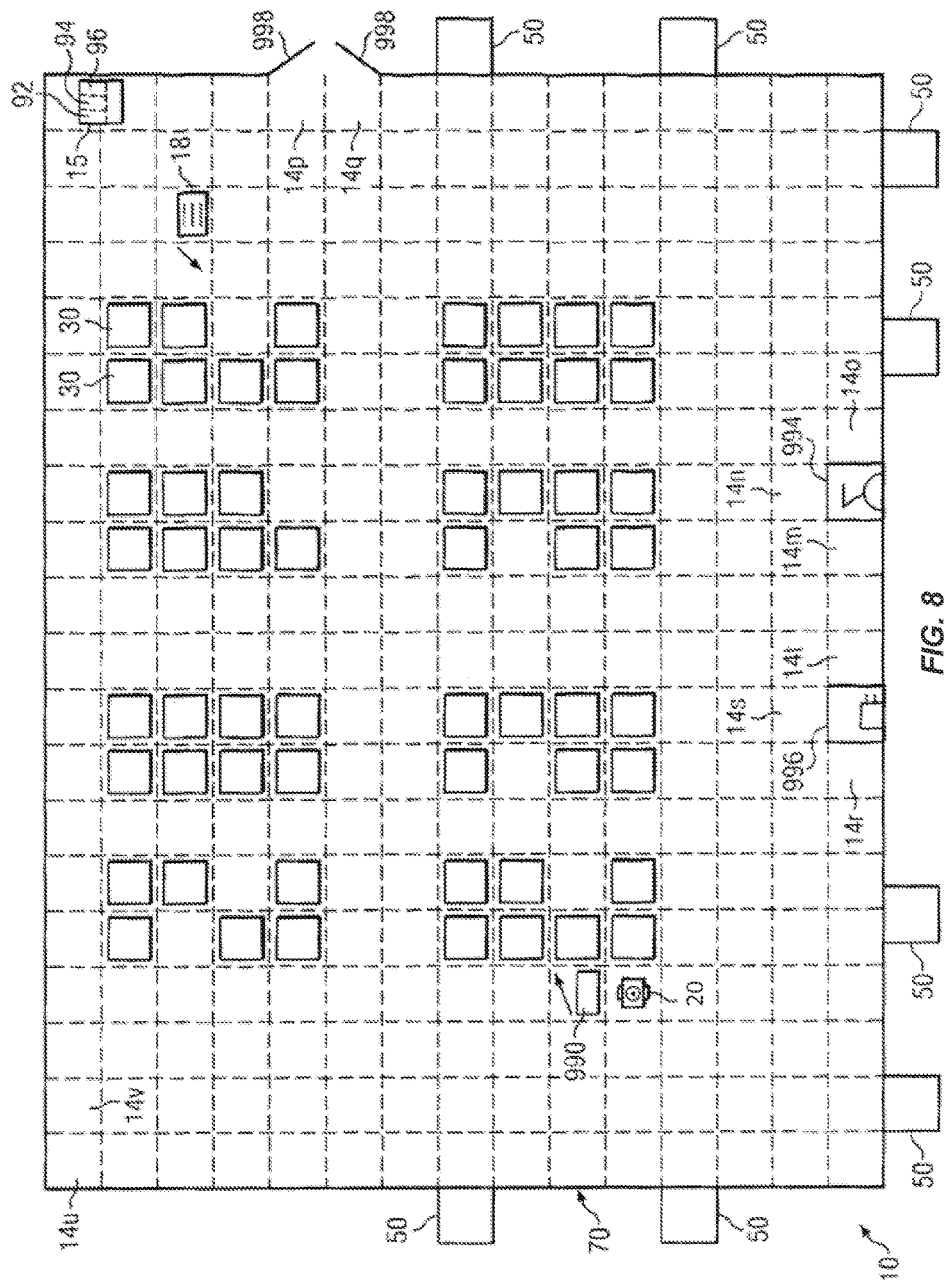
FIG. 8 illustrates the placement of mobile drive units in the inventory system shown in FIG. 3 based on their capability state, in accordance with many embodiments.

FIG. 8 illustrates an example of how the resource scheduling module 92 may use a capability state of a mobile drive unit 20 to determine a location for that mobile drive unit 20. By determining an appropriate destination for a mobile drive unit 20 based on the repair status, battery charge state, and/or any other consideration relating to the ability of that mobile drive unit 20 to complete assigned tasks, in general, and/or to complete a particular assigned task, the resource scheduling module 92 may optimize the placement of mobile drive units 20 in need of repair, re-supply, and/or other types of maintenance to regain or improve their capability of completing assigned tasks.

In the illustrated example, the resource scheduling module 92 determines the state or a particular aspect of the state of a mobile drive unit 20. In particular, in this example, the resource scheduling module 92 determines a capability state of the mobile drive unit 20. The capability state may relate to the repair status, supply status, maintenance status, and/or any other aspect of the mobile drive unit's current ability or anticipated future ability to complete assigned tasks.

The resource scheduling module 92 may determine the capability state of one or more mobile drive units 20 in any suitable manner. In the illustrated embodiment, each of one or more mobile drive units 20 is configured to transmit a capability message 990 when its capabilities change and/or an event affecting its capabilities occurs. For example, a mobile drive unit 20 may transmit a capability message 990 when its fuel level or battery charge level drops, parts or components of the mobile drive unit 20 break or become unusable, a scheduled maintenance period for the mobile drive unit 20 elapses, or any other event occurs affecting or potentially affecting the ability of the mobile drive unit 20 to complete assigned tasks and/or remain active. In alternative embodiments, the resource scheduling module 92 may monitor various characteristics of the mobile drive units 20 or events associated with the mobile drive units 20 as part of its normal operation and determine the capability state of the mobile drive units 20 based on the monitored information. In yet other embodiments, the resource scheduling module 92 may receive information from other components of the inventory system 10 from which the resource scheduling module 92 determines the capability state of the mobile drive units 20. In general, however, the resource scheduling module 92 may determine the capability state of a particular mobile drive unit 20 using any appropriate information obtained from any suitable source.

Returning to the illustrated example, the resource scheduling module 92, after determining the capability state of the mobile drive unit 20 from the capability message 990, selects a location for the mobile drive unit 20 based on this capability state. The resource scheduling module 92 then generates a task assignment 18 identifying the selected location and transmits task assignment 18 to the mobile drive unit 20 for completion. By selecting a destination appropriate for the mobile drive unit 20 based on its capability state, the resource scheduling module 92 may be able to reduce the effects of damage, low battery charge state, and other debilitating occurrences on the congestion, throughput, and responsiveness of the inventory system 10.

As one example, in particular embodiments, the capability state of the mobile drive unit 20 may relate to its state of repair. If any components, or a specific component, of the mobile drive unit 20 breaks or becomes unusable, the mobile drive unit 20 may transmit a capability message 990 to the resource scheduling module 92. The resource scheduling module 92 may then select a destination for mobile drive unit 20 based on the knowledge that the mobile drive unit 20 needs repair. In particular embodiments, the inventory system 10 may include automated repair stations 994 that are capable of repairing certain types of malfunctions or replacing certain types of parts. For example, the inventory system 10 may include an automated repair station 994 that can replace blown tires, clean sensors, or perform other types of repairs with limited or no human involvement. In such embodiments, the resource scheduling module 92 may select a destination at or near an appropriate automated repair station 994, such as cells 14m, 14n, and 14o, in response to determining the mobile drive unit 20 needs repair or, in response to determining the mobile drive unit 20 needs a particular type of repair.

As another example, in particular embodiments, the inventory system 10 may include cells 14, such as cells 14p and 14q that provide easy access for human operators attempting to repair the mobile drive units 20, and the resource scheduling module 92 may be configured to send the mobile drive units 20 to these cells for at least certain types of repairs. In particular embodiments, such as the one illustrated in FIG. 8, some or all of the workspace 70 may be enclosed by a wall, railing, or other barrier that prevents or limits entry to the workspace 70 and the resource scheduling module 92 may select a destination near access points to the workspace 70 (such as doors 998 in FIG. 8). Alternatively or additionally, the resource scheduling module 92 may select a destination that is located away from high-traffic areas, reserved for repair work, or otherwise situated to allow human operators safe and/or easy access to the mobile drive units needing repair. Thus, in response to determining the mobile drive unit 20 needs repair or, in response to determining the mobile drive unit 20 needs a particular type of repair (e.g., a type of repair too complicated for automated repair station 994), the resource scheduling module 92 may select a destination, such as cells 14$p$ and 14$q$, for the mobile drive unit 20 that is easily accessible to human operators.

As yet another example, in particular embodiments, the capability state of the mobile drive unit 20 may relate to its fuel or charge level. For example, in particular embodiments, the mobile drive unit 20 may transmit a capability message 990 indicating its fuel level, battery charge, or other appropriate form of energy level to the resource scheduling module 92. The resource scheduling module 92 may then select an appropriate destination for the mobile drive unit 20 based on this information. In particular embodiments, the inventory system 10 may include one or more battery charging stations 996 at which the mobile drive units 20 may be recharged or refueled, receive a new battery, or otherwise receive additional energy for responding to assigned tasks. Thus, in response to determining the mobile drive unit 20 needs refueling or recharging, resource scheduling module 92 may select a destination, such as cells 14$r$, 14$s$, or 14$t$, that is close to an appropriate battery charging station 996.

As yet another example, in particular embodiments, the resource scheduling module 92 may be configured to send the mobile drive units 20 that need repair, refuel, or recharging to low-traffic cells 14. Consequently, in such embodiments, the mobile drive units 20 that are not capable of completing assigned tasks will not impede traffic while awaiting repair or removal from the inventory system 10. In doing so, the resource scheduling module 92 may consider the frequency with which a particular cell 14 is included in paths generated by the route planning module 94, the frequency with which segments that include that cell 14 are requested for reservation, and/or any other appropriate indicator of traffic flow, and may then select a destination for the mobile drive unit 20 from among cells 14 that are only infrequently used by the mobile drive units 20. Additionally, when selecting a destination for such mobile drive units 20, the resource scheduling module 92 may consider the fact that, because of physical constraints, system policies, and/or any other suitable considerations a particular cell 14 is not otherwise available as a destination for the mobile drive units 20 and/or for the mobile drive units 20 to move through. In FIG. 8, cells 14$u$ and 14$v$ are assumed, for the purposes of this example, to be infrequently used by the mobile drive units 20 and thus illustrate an example of this type of location. Thus, in response to determining the mobile drive unit 20 needs repair or, in response to determining the mobile drive unit 20 needs a particular type of repair, the resource scheduling module 92 may select a destination in a low-traffic area, such as cells 14$u$ or 14$v$.

As yet another example, the resource scheduling module 92 may select a particular task or tasks for a mobile drive unit 20 based on the degraded capabilities of the mobile drive unit 20. Thus, when resource scheduling module 92 detects that a mobile drive unit 20 is in a state of disrepair, low on batteries or fuel, or otherwise in a state of degraded capabilities, the resource scheduling module 92 may assign that mobile drive unit 20 a task associated with lighter inventory holders 30, inventory holders 30 closer to the position of the mobile drive unit 20, or otherwise better suited for transport by the degraded mobile drive unit 20 than the inventory holders 30 associated with other tasks. As a result, the resource scheduling module 92 may select for the relevant mobile drive unit 20 a destination location associated with such inventory holders 30.

More generally, the resource scheduling module 92 may select any particular type of location as a destination for a mobile drive unit 20 having a particular capability state. Additionally, while FIG. 8 illustrates an example configuration in which particular types of cells 14 that may be selected as destinations are located in particular locations in the workspace 70, the resource scheduling module 92 may utilize destinations of any type located anywhere within the workspace 70.

After the resource scheduling module 92 selects an appropriate destination for the mobile drive unit 20 based on its capability state, the resource scheduling module 92 communicates the destination to the mobile drive unit 20. In the illustrated example, the resource scheduling module 92 communicates the destination by transmitting a task assignment 18 to the mobile drive unit 20 that identifies the selected destination. The mobile drive unit 20 then requests a path to the selected destination and travels the path to the selected destination. In particular embodiments, the mobile drive unit 20 may then remain at the selected destination until being repaired or receiving appropriate maintenance. The mobile drive unit 20 may then become available to receive other task assignments from the resource scheduling module 92.

Although the above description focuses on an example in which the mobile drive unit 20 transmits information indicating its capability state to the resource scheduling module 92, in particular embodiments, the resource scheduling module 92 may instead determine the capability state of a particular mobile drive unit 20 based on information the resource scheduling module 92 retrieves from a source other than the relevant mobile drive unit 20. For example, in particular embodiments, the mobile drive unit 20 may be repaired or maintained according to a repair or maintenance schedule, and the resource scheduling module 92 may determine the capability state of a particular mobile drive unit 20 based on this schedule and stored information indicating the last time the relevant mobile drive unit 20 was repaired or received maintenance.

Thus, by selecting parking spaces for the mobile drive units 20 that increase the speed or ease with which the mobile drive units 20 can be repaired, refueled, recharged, maintained, or otherwise have their capabilities restored, the resource scheduling module 92 can limit the negative impact of the mobile drive units 20 that are damaged, expended, or otherwise incapable of completing assigned tasks. Moreover, by choosing parking spaces in low-traffic areas for such mobile drive units 20, particular embodiments of resource scheduling module 92 may reduce the probability that such mobile drive units 20 will create congestion while they await repair or maintenance. More generally, a particular embodiment of the inventory system 10 may be configured to use the knowledge that a particular mobile drive unit 20 is damaged, expended, or otherwise incapable of completing assigned tasks in any appropriate manner to select a destination for that mobile drive unit 20. By strategically locating the mobile drive units 20 that are in such a state, the resource scheduling module 92 can further increase the overall efficiency and throughput of the inventory system 10.

Figure 9:
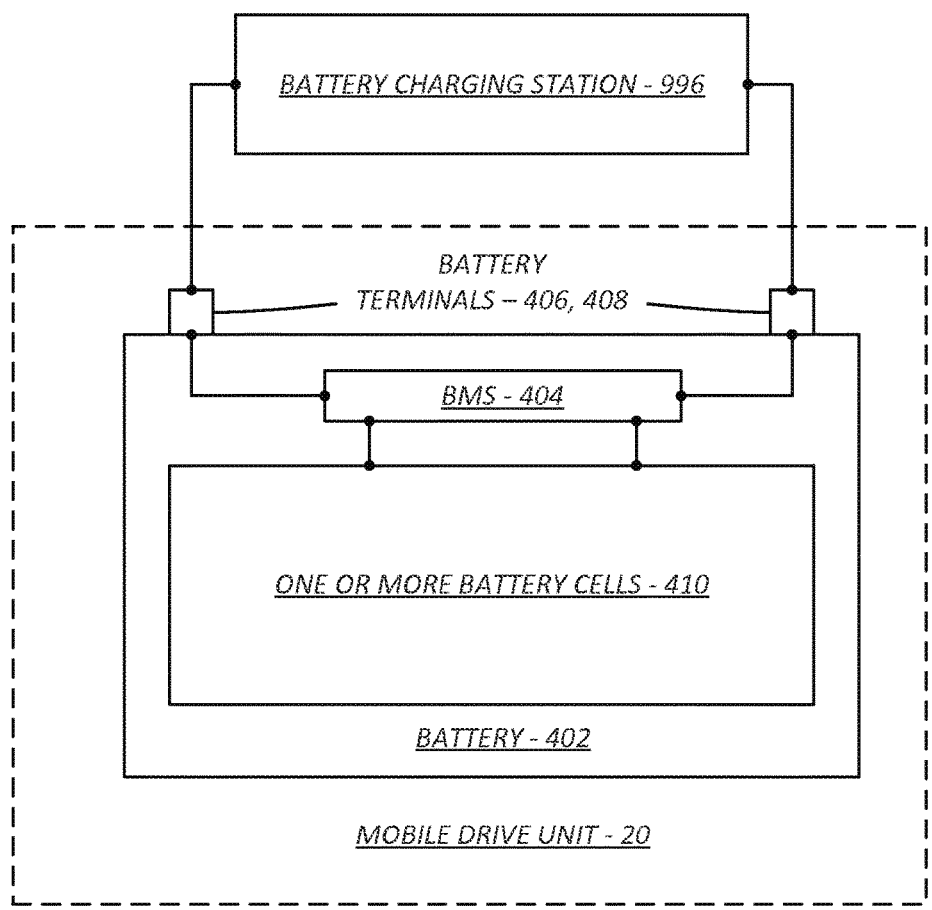
FIG. 9 is a simplified schematic diagram illustrating a mobile drive unit that is powered by a battery that includes an integral battery management system configured to measure battery voltage and charging current during recharging of the battery, in accordance with many embodiments.

In many embodiments, the mobile drive unit 20 includes a rechargeable battery that is repeatedly recharged via the one or more battery charging stations 996. For example, FIG. 9 is a simplified schematic diagram illustrating a mobile drive unit 20 having a rechargeable battery 402 that includes an integral battery management system (BMS) 404 configured to measure battery voltage and charging current applied to the battery 402 by one of the battery charging stations 996 during recharging, in accordance with many embodiments. In many embodiments, the rechargeable battery 402 is a lithium battery having a built in electronic supervisory system (e.g., BMS 404) configured to accurately measure battery voltage to generate voltage data, current flowing from/to the battery to generate current data, and internal temperature of the battery to generate battery temperature data for each recharging instance of the battery for use in assessing the condition of the battery 402 using the approaches described herein. The BMS 404 is operatively connected between battery terminals 406, 408 of the battery 402 and one or more cells 410 of the battery 402. In many embodiments, the voltage data generated corresponds to the voltage increase value (dv) described herein and measured with respect to the battery terminals 406, 408. Likewise, in many embodiments, the current data generated corresponds to the associated current increase (Ichg) described herein and measured with respect to the battery terminals 406, 408. And in many embodiments, the battery temperature data corresponds to the internal temperature of the battery 402 at the beginning of the recharging instance as illustrated in FIG. 2.

In many embodiments, the BMS 404 is configured to transmit the voltage data, the current data, and the battery temperature data, for each recharging instance, to the mobile drive unit 20 and/or the management module 15. For example, the BMS 404 can be configured to communicate the voltage data, the current data, and the battery temperature data to the mobile drive unit 20 and/or the management module 15 via any suitable communication means, for example, via one or more of a serial communication link, direct wiring, serial communication over a power line, and/or wireless communication using any suitable wireless communication hardware and protocol. The BMS 404 can also be configured to process the voltage data, current data, and battery temperature data using the approaches described herein to estimate and/or monitor the condition of the battery 402 to determine when the battery condition is in a degraded state and/or to determine when the battery condition is such that the battery 402 is approaching or has reached an end-of-life (EOL) condition and should be replaced or scheduled to be replaced. In such embodiments, the BMS 404 can communicate to the mobile drive unit 20 and/or the management module 15 the condition of the battery so that the battery can be replaced or scheduled for replacement.

In many embodiments, the mobile drive unit 20 and/or the management module 15 is configured to receive and store the voltage data, the current data, and the battery temperature data for each recharging instance. Where the data is transferred to the management module 15, the management module can store the data for each of the mobile drive units 20. The stored voltage data, current data, and battery temperature data can be processed by the mobile drive unit 20 and/or the management module 15 using the approaches described herein to estimate and/or monitor the condition of the batteries of the mobile drive units 20 so as to determine when the battery condition is in a degraded state and/or to determine when the battery condition is such that the battery is approaching or has reached an end-of-life (EOL) condition and should be replaced or scheduled to be replaced.

Figure 10:
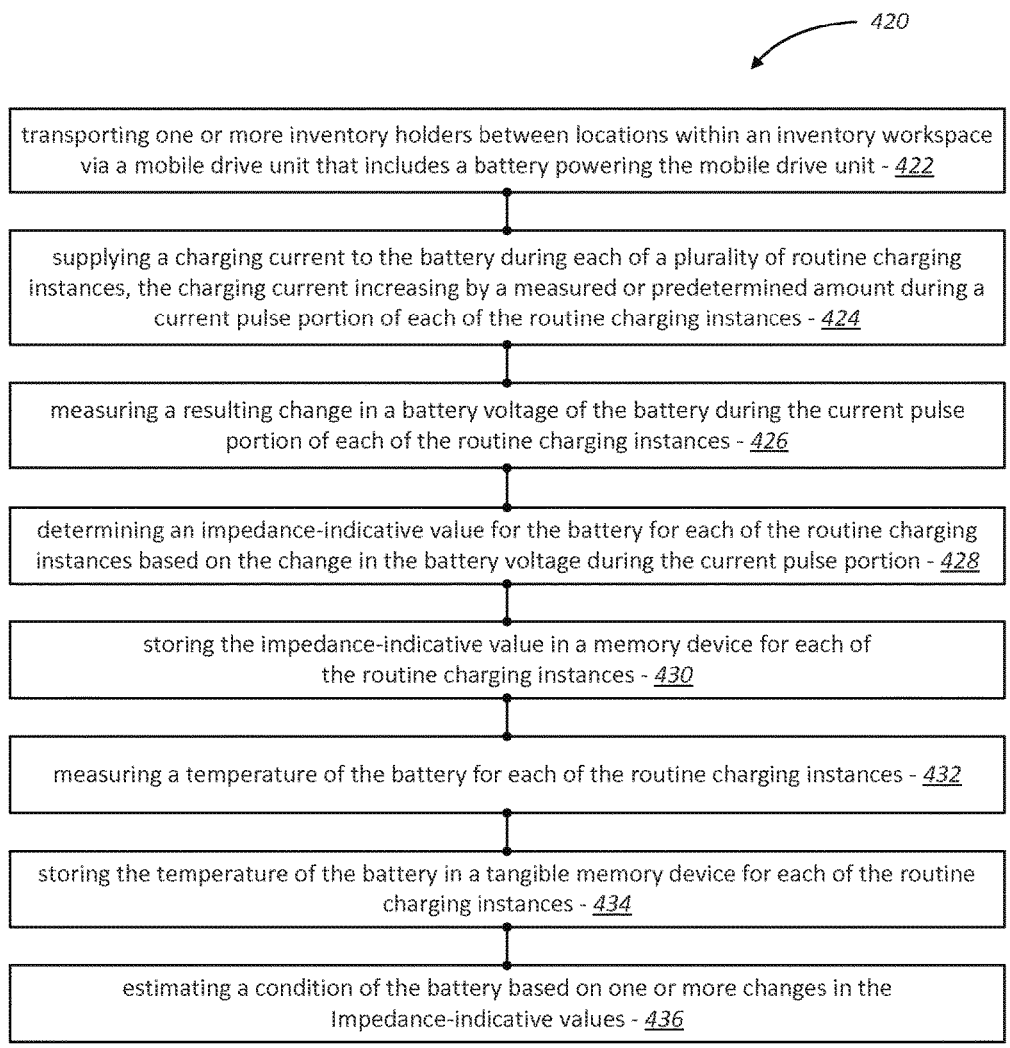
FIG. 10 is a simplified flow diagram illustrating a process for estimating a condition of a battery based on battery impedance values obtained during recharging instances, in accordance with many embodiments.

FIG. 10 is a simplified flow diagram illustrating acts of a process 420 of estimating a condition of a battery based on battery impedance-indicative values obtained during routine recharging instances, in accordance with many embodiments. In many embodiments, the inventory system 10 is configured to accomplish the process 420. Some or all of the process 420 (or any other processes described herein, or variations, and/or combinations thereof) may be performed under the control of one or more computer systems configured with executable instructions and may be implemented as code (e.g., executable instructions, one or more computer programs, or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory.

The process 420 includes transporting one or more inventory holders between locations within an inventory workspace via a mobile drive unit that includes a battery powering the mobile drive unit (act 422). For example, as described herein, the mobile drive unit 20 is used to transport one or more inventory holders 30 between locations in the inventory workspace 70 of the inventory system 10. In many embodiments, the mobile drive unit 20 includes the rechargeable battery 402, which is routinely recharged repeatedly over time.

During each routine recharging instance, a charging current is supplied to the battery. In many embodiments, the charging current increases by a measured or predetermined amount during a current pulse portion of each of the routine charging instances (act 424). The current pulse portion can occur at the start of each of the routine charging instances. The charging current can increase by a predetermined amount (e.g., approximately the same current increase for each of the charging instances). In many embodiments, the charging current is measured during each of the recharging instances so that variations in the charging current can be accounted for in determining the battery impedance-indicative values. In many embodiments, such as when the battery is a lithium battery, the charging current applied to the battery at the start of the charging instance can be relatively quickly ramped up from zero to the charging current (Ichg), such as illustrated in FIG. 2.

The battery voltage increases in proportion to the internal impedance of the battery and the charging current. The process 420 includes measuring a resulting change in battery voltage during the current pulse portion of each of the routine charging instances (act 426). The charging current applied to the battery can be compared to a threshold value. If the charging current is below the threshold value (i.e., the battery still had significant charge remaining), then we discard the current and voltage data from that recharging instance can be discarded, since such current and voltage data may produce unreliable impedance values.

The process 420 includes determining a battery impedance-indicative value of the battery for each of the routine charging instances based on the change in battery voltage during the current pulse portion (act 428). Any suitable value can be used as the battery impedance-indicative value. For example, when the charging current applied to the battery increases by a predetermined unchanging value for each of the routine charging instances, the value of the measured resulting change in battery voltage can be used as the battery impedance-indicative value for each of the respective routine charging instances. Alternatively, the battery impedance-indicative value of the battery can represent an actual impedance value calculated based on actual measured charging current and resulting battery voltage increase for each of the routine charging instances.

The battery impedance-indicative value is stored in a memory device for each of the routine charging instances (act 430). For example, in the inventory system 10, the battery impedance-indicative value can be communicated to the management module 15 for storage within the memory 91 or to the mobile drive unit 20 for storage within the control module 170.

In many applications, the internal temperature of the rechargeable battery varies between recharging instances. Accordingly, to account for temperature induced variation in internal impedance of the rechargeable battery, the process 420 includes measuring a temperature of the battery for each of the routine charging instances (act 432) and storing the temperature of the battery in a tangible memory device for each of the routine charging instances (act 434).

The process 420 includes estimating a condition of the battery based on one or more changes in the battery impedance-indicative values (act 436). For example, in many embodiments of the inventory system 10, the mobile drive unit 20 includes a rechargeable lithium battery having, at a selected reference temperature, a beginning-of-life (BOL) internal impedance of 20 to 30 milliohms and an end-of-life (EOL) internal impedance of 40 to 60 milliohms. Accordingly, when a charging current increase of 115 A is used, the voltage increase value (dv) when the battery has the BOL internal impedance is in the range of 2.3 to 3.45 volts and the voltage increase value (dv) when the battery has the EOL internal impedance is in the range of 4.6 to 6.9 volts.

In many embodiments, estimating the condition of the battery is further based on the temperature of the battery stored for each of the plurality of the routine charging instances. For example, the process 420 can include determining a set of battery impedance-indicative values, based on the voltage increase values, the charging currents, and the temperature values, that accounts for impedance variation induced by variation in the temperature values. The condition of the battery can be estimated based on changes over time in the set of battery impedance-indicative values that account for impedance variation induced by variation in the temperature values.

Battery Condition Monitoring in Rechargeable Devices

Figure 11:
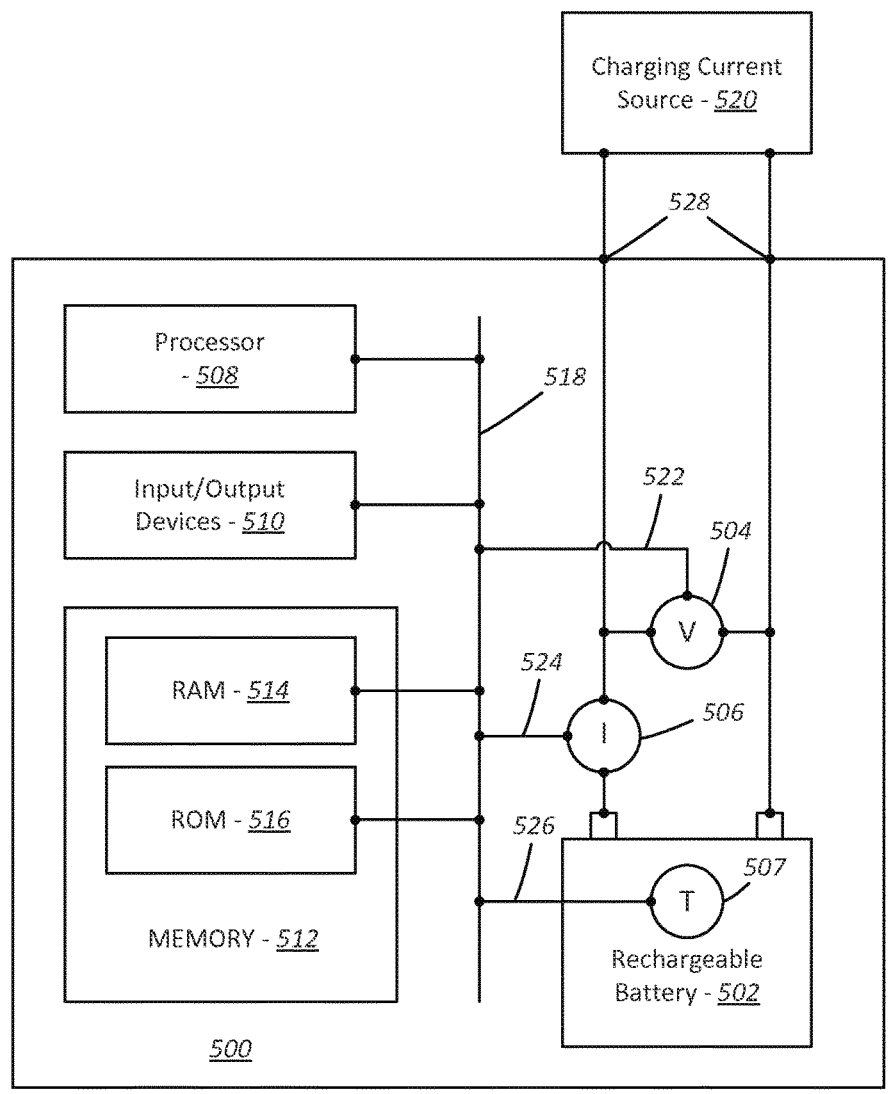
FIG. 11 is a simplified schematic diagram illustrating a rechargeable device configured to measure battery voltage and charging current during recharging of the device for use in monitoring the condition of the battery, in accordance with many embodiments.

FIG. 11 is a simplified schematic diagram illustrating a rechargeable battery-powered device 500, in accordance with many embodiments. The device 500 includes a rechargeable battery 502 and is configured to monitor the condition of the rechargeable battery 502. The device 500 can be embodied in any suitable device, for example, portable electronic devices such as cellular phones or any other suitable device having a rechargeable battery. The device 500 includes the rechargeable battery 502, a voltage sensor 504, a current sensor 506, a temperature sensor 507, at least one processor 508, one or more input/output devices 510, and a tangible memory device 512. The tangible memory device 512 includes a random access memory (RAM) 514 and read only memory (ROM) 516. The processor 508, the input/output devices 510, the RAM 514 and the ROM 516 are communicatively coupled via a data bus 518. The rechargeable battery 502 can include a battery management system (BMS) (which can be configured similar to the BMS 404 described herein shown in FIG. 9) that includes the voltage sensor 504, the current sensor 506, and the temperature sensor 507.

The current sensor 506 measures the charging current applied to the rechargeable battery 502 during routine recharging instances via a charging current source 520. The voltage sensor 504 measures the increase in battery voltage resulting from the application of the charging current to the battery 502. The temperature sensor 507 measures the temperature of the battery 502 during recharging of the battery 502 via the charging current source 520. The voltage sensor 504, the current sensor 506 and the temperature sensor 507 generate respective output signals that are communicated to the processor 508 via data lines 522, 524, 526 and the data bus 518.

In many embodiments, the rechargeable battery powered device 500 includes a battery-powered portion providing functionality of the device, a port 528, and a control unit. The battery 502 is operatively coupled with the battery-powered portion to supply electrical power to the battery-powered portion. The port 526 is operatively coupled with the battery 502 and connectable with the charging current source 520 to charge the battery 502 via a charging current applied to the battery from the charging current source 520 during a charging instance. In many embodiments, the charging current applied to the battery 502 by the charging current source 520 increases by a measured or predetermined amount during a current pulse portion of the charging instance so as to produce a resulting change in battery voltage during the current pulse portion of the routine charging instance. The control unit includes the processor 508 and the memory 512. The memory 512 (e.g., the RAM 514) stores non-transitory instructions executable by the processor to: (a) cause the processor to receive the resulting change in voltage measured by the voltage sensor 504 associated with the increase in charging current for each of a plurality of routine charging instances of the battery 502; (b) determine a battery impedance-indicative value for the battery 502 for each of the plurality of routine charging instances based on the respective resulting change in battery voltage as measured by the voltage sensor 504; (c) store the battery impedance-indicative values in the memory 512 (e.g., in the RAM 514); (d) receive and store a temperature value, for each of the plurality of routine charging instances of the battery, that is indicative of a temperature of the battery; (e) determine a set of battery impedance-indicative values, based on the battery impedance-indicative values and the temperature values, that accounts for impedance variation induced by variation in the temperature values; and (f) estimate a condition of the battery based on changes over time in the set of battery impedance-indicative values.

In many embodiments, the charging current is measured to determine how much the charging current increases. To avoid noise induced error that may arise for recharging instances having relatively low charging current, the set of battery impedance-indicative values can exclude battery impedance-indicative values based on each of the routine recharging instances having a charging current increase less than a predetermined charging current increase magnitude.

In many embodiments, the instructions are executable by the processor to cause the process or to determine when the estimated condition of the battery is indicative of the battery needing to be replaced or indicative that the battery is approaching a condition where the battery should be replaced. In many embodiments, the instructions are executable by the processor 508 to cause the processor 508 to output an indication via the input/output device 510 that the battery 508 needs to be replaced or is approaching a condition where the battery should be replaced.

In many embodiments, the rechargeable device 500 is configured to measure the charging current increase during the current pulse portion of each of the plurality of charging instances. In such embodiments, the instructions can be executable by the processor to cause the processor 508 to determine the impedance value of the battery 502 for each of the plurality of charging instances based on the respective measured charging current increase and the respective change in battery voltage.

In many embodiments of the device 500, the current pulse portion of each of the plurality of charging instances, during which the charging current and resulting battery voltage increase is measured, occurs at the start of the charging instance. The current pulse portion of each of the plurality of charging instances can have a duration selected to avoid any significant increase in a temperature of the battery (e.g., greater than 1 degree Celsius), during the current pulse portion so as to avoid temperature induced variation in the resulting measured voltage increase. For example, in embodiments of the mobile drive unit 20, the current pulse portion can have a duration of less than 3 seconds. Battery temperature is a continuous parameter. Empirically measured battery temperature change rate during charging of an example mobile drive unit 20 is approximately 1 degree Celsius per minute thereby producing about 0.05 degrees Celsius increase for a current pulse portion of 3 second duration. Although battery temperature increase during the current pulse portion is expected to differ based on particular battery characteristics, the battery temperature increase during the current pulse portion is generally expected to be small for current pulse portions having a suitably short duration. Accordingly, in many embodiments, the battery temperature is sampled once during the current pulse portion (e.g., at the start of the current pulse portion or just before). In view of the expected small increase in battery temperature during the current pulse portion, any temperature induced changes in battery impedance are expected to be insignificant, especially where the current step is repeatable.

Figure 12:
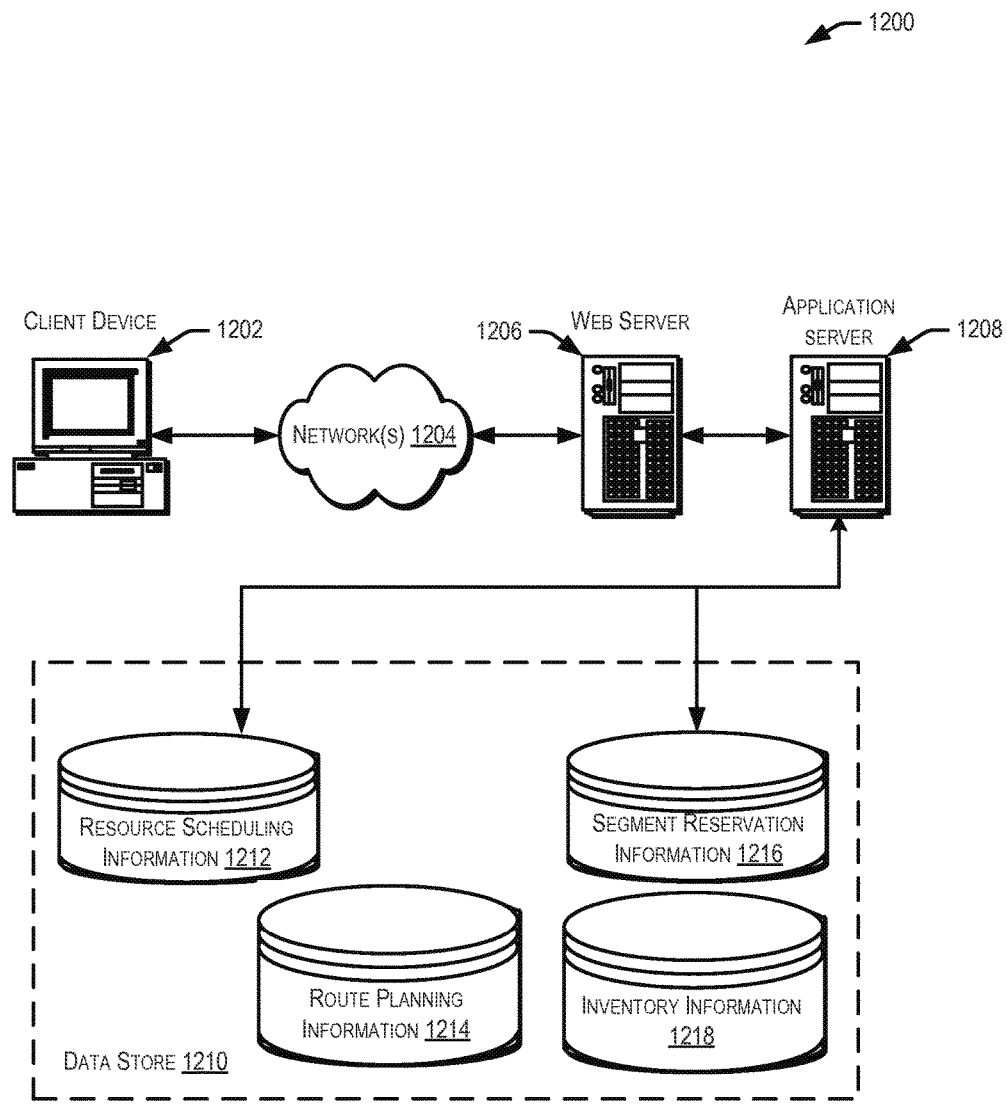
FIG. 12 illustrates an environment in which various embodiments can be implemented.

FIG. 12 illustrates aspects of an example environment 1200 for implementing aspects in accordance with various embodiments. As will be appreciated, although a Web-based environment is used for purposes of explanation, different environments may be used, as appropriate, to implement various embodiments. The environment includes an electronic client device 1202, which can include any appropriate device operable to send and receive requests, messages, or information over an appropriate network 1204 and convey information back to a user of the device. Examples of such client devices include personal computers, cell phones, handheld messaging devices, laptop computers, set-top boxes, personal data assistants, electronic book readers, and the like. The network can include any appropriate network, including an intranet, the Internet, a cellular network, a local area network, or any other such network or combination thereof. Components used for such a system can depend at least in part upon the type of network and/or environment selected. Protocols and components for communicating via such a network are well known and will not be discussed herein in detail. Communication over the network can be enabled by wired or wireless connections and combinations thereof. In this example, the network includes the Internet, as the environment includes a Web server 1206 for receiving requests and serving content in response thereto, although for other networks an alternative device serving a similar purpose could be used as would be apparent to one of ordinary skill in the art.

The illustrative environment includes at least one application server 1208 and a data store 1210. It should be understood that there can be several application servers, layers, or other elements, processes, or components, which may be chained or otherwise configured, which can interact to perform tasks such as obtaining data from an appropriate data store. As used herein the term "data store" refers to any device or combination of devices capable of storing, accessing, and retrieving data, which may include any combination and number of data servers, databases, data storage devices, and data storage media, in any standard, distributed, or clustered environment. The application server can include any appropriate hardware and software for integrating with the data store as needed to execute aspects of one or more applications for the client device, handling a majority of the data access and business logic for an application. The application server provides access control services in cooperation with the data store and is able to generate content such as text, graphics, audio, and/or video to be transferred to the user, which may be served to the user by the Web server in the form of HyperText Markup Language ("HTML"), Extensible Markup Language ("XML"), or another appropriate structured language in this example. The handling of all requests and responses, as well as the delivery of content between the client device 1202 and the application server 1208, can be handled by the Web server. It should be understood that the Web and application servers are not required and are merely example components, as structured code discussed herein can be executed on any appropriate device or host machine as discussed elsewhere herein.

The data store 1210 can include several separate data tables, databases or other data storage mechanisms and media for storing data relating to a particular aspect. For example, the data store illustrated includes mechanisms for storing resource scheduling information 1212, route planning information 1214, segment reservation information 1216 and inventory information 1218. It should be understood that there can be many other aspects that may need to be stored in the data store, such as for page image information and to access right information, which can be stored in any of the above listed mechanisms as appropriate or in additional mechanisms in the data store 1210. The data store 1210 is operable, through logic associated therewith, to receive instructions from the application server 1208 and obtain, update or otherwise process data in response thereto. In one example, a user might submit a search request for a certain type of item. In this case, the data store might access the user information to verify the identity of the user and can access the catalog detail information to obtain information about items of that type. The information then can be returned to the user, such as in a results listing on a Web page that the user is able to view via a browser on the user device 1202. Information for a particular item of interest can be viewed in a dedicated page or window of the browser.

Each server typically will include an operating system that provides executable program instructions for the general administration and operation of that server and typically will include a computer-readable storage medium (e.g., a hard disk, random access memory, read only memory, etc.) storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 12. Thus, the depiction of the system 1200 in FIG. 12 should be taken as being illustrative in nature and not limiting to the scope of the disclosure.

The various embodiments further can be implemented in a wide variety of operating environments, which in some cases can include one or more user computers, computing devices or processing devices which can be used to operate any of a number of applications. User or client devices can include any of a number of general purpose personal computers, such as desktop or laptop computers running a standard operating system, as well as cellular, wireless, and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems, and other devices capable of communicating via a network.

Most embodiments utilize at least one network that would be familiar to those skilled in the art for supporting communications using any of a variety of commercially-available protocols, such as Transmission Control Protocol/Internet Protocol ("TCP/IP"), Open System Interconnection ("OSI"), File Transfer Protocol ("FTP"), Universal Plug and Play ("UpnP"), Network File System ("NFS"), Common Internet File System ("CIFS"), and AppleTalk. The network can be, for example, a local area network, a wide-area network, a virtual private network, the Internet, an intranet, an extranet, a public switched telephone network, an infrared network, a wireless network, and any combination thereof.

In embodiments utilizing a Web server, the Web server can run any of a variety of server or mid-tier applications, including Hypertext Transfer Protocol ("HTTP") servers, FTP servers, Common Gateway Interface ("CGI") servers, data servers, Java servers, and business application servers. The server(s) also may be capable of executing programs or scripts in response to requests from user devices, such as by executing one or more Web applications that may be implemented as one or more scripts or programs written in any programming language, such as Java®, C, C#, or C++, or any scripting language, such as Perl, Python, or TCL, as well as combinations thereof. The server(s) may also include database servers, including without limitation those commercially available from Oracle®, Microsoft®, Sybase®, and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers, or other network devices may be stored locally and/or remotely, as appropriate. Where a system includes computerized devices, each such device can include hardware elements that may be electrically coupled via a bus, the elements including, for example, at least one central processing unit ("CPU"), at least one input device (e.g., a mouse, keyboard, controller, touch screen, or keypad), and at least one output device (e.g., a display device, printer, or speaker). Such a system may also include one or more storage devices, such as disk drives, optical storage devices, and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired)), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets), or both. Further, connection to other computing devices such as network input/output devices may be employed.

Storage media computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules, or other data, including RAM, ROM, Electrically Erasable Programmable Read-Only Memory ("EEPROM"), flash memory or other memory technology, Compact Disc Read-Only Memory ("CD-ROM"), digital versatile disk (DVD), or other optical storage, magnetic cassettes, magnetic tape, magnetic disk storage, or other magnetic storage devices, or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y. or at least one of Z to each be present.

Preferred embodiments of this disclosure are described herein, including the best mode known to the inventors for carrying out the disclosure. Variations of those preferred embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. An inventory management system, comprising:
an inventory workspace;
a plurality of inventory holders, each of the plurality of inventory holders being configured to store one or more inventory items;
a plurality of mobile drive units, each of the plurality of mobile drive units including a respective battery powering the mobile drive unit to transport one or more of the plurality of inventory holders between locations within the inventory workspace;
a battery charging station to which each mobile drive unit of the plurality of mobile drive units can be routinely coupled to charge the respective battery of the mobile drive unit during normal operation of the mobile drive unit, the battery charging station being configured to supply a charging current to the battery during a charging period, the charging current increasing by a measured or predetermined amount during an initial current pulse portion of the charging period during which the charging current increases from a zero initial current to a target charging current and producing a resulting change in a battery voltage of the battery during the initial current pulse portion of the charging period; and
a control unit comprising a processor and a tangible memory device storing non-transitory instructions executable by processor to cause the processor to, for each of the batteries:
determine and store a first value, for each of a plurality of routine charging instances of the battery, that is indicative of an impedance of the battery and based on the resulting change in the battery voltage produced by the charging current during the initial current pulse portion of each of the routine charging instances;
receive and store a temperature value, for each of the plurality of routine charging instances of the battery, that is indicative of a temperature of the battery;
determine, for each of the plurality of routine charging instances of the battery, a set of battery impedance-indicative values, based on the first values and the temperature values, that accounts for impedance variation induced by variation in the temperature values;
store the battery impedance-indicative values for the battery in a tangible memory device for each of the plurality of routine charging instances;
estimate a condition of the battery based on changes over time in the set of battery impedance-indicative values; and
compare one or more changes in the battery impedance-indicative values for one of the batteries with one or more changes in the battery impedance-indicative values for one or more other batteries to determine that the estimated condition of the one of the batteries is indicative of the one of the batteries needing to be replaced.

2. The inventory management system of claim 1, wherein:
the charging current is measured; and
the set of battery impedance-indicative values excludes battery impedance-indicative values for routine charging instances having a charging current less than a predetermined magnitude.

3. The inventory management system of claim 1, wherein:
the charging current is measured for each of the plurality of the routine charging instances;
the first value is calculated for each of the plurality of routine charging instances based on the measured charging current and the resulting change in the battery voltage produced by the charging current;
a temperature-corrected impedance value is calculated for each of the plurality of routine charging instances based on the respective first value and the respective temperature value; and the set of battery impedance-indicative values includes the temperature-corrected impedance values.

4. The inventory management system of claim 1, wherein the instructions are executable by the processor to cause the processor to determine that the estimated condition of the battery is indicative of the battery needing to be replaced.

5. A computer-implemented method of estimating a condition of a battery of a mobile drive unit for moving inventory holders in an inventory management system, wherein the inventory management system comprises a plurality of mobile drive units, each of the plurality of mobile drive units including a respective battery powering the mobile drive unit, the computer-implemented method comprising for each of the batteries:
   supplying a charging current to the battery during each of a respective plurality of routine charging instances during normal operation of the mobile drive unit, the charging current increasing by a measured or predetermined amount during an initial current pulse portion of each of the plurality of routine charging instances;
   measuring a resulting change in a battery voltage of the battery during the initial current pulse portion of each of the plurality of routine charging instances, wherein during the initial current pulse portion the charging current increases from a zero initial current to a target charging current;
   determining a battery impedance-indicative value for the battery for each of the respective plurality of routine charging instances based on the change in the battery voltage during the initial current pulse portion of each of the respective plurality of routine charging instances;
   storing the battery impedance-indicative values for the battery in a tangible memory device for each of the plurality of routine charging instances;
   estimating a condition of the battery based on one or more changes in the battery impedance-indicative values; and
   comparing one or more changes in the battery impedance-indicative values for one of the batteries with one or more changes in the battery impedance-indicative values for one or more other batteries to determine that the estimated condition of the one of the batteries is indicative of the one of the batteries needing to be replaced.

6. The computer-implemented method of claim 5, comprising:
   measuring a temperature of the battery for each of the plurality of routine charging instances; and
   storing the temperature of the battery in a tangible memory device for each of the plurality of routine charging instances,
   wherein estimating the condition of the battery is further based on the temperature of the battery stored for each of the plurality of routine charging instances so as to account for impedance variation induced by variation in the battery temperatures.

7. The computer-implemented method of claim 6, wherein:
   the charging current is measured for each of a plurality of the routine charging instances;
   a temperature-corrected battery impedance value is calculated for each of the plurality of routine charging instances based on the measured charging current, the change in battery voltage, and the respective temperature value; and
   the battery impedance-indicative values include the temperature-corrected battery impedance values.

8. The computer-implemented method of claim 5, wherein:
   the charging current is measured; and
   the battery impedance-indicative values exclude battery impedance-indicative values based on routine charging instances having a charging current less than a predetermined magnitude.

9. The computer-implemented method of claim 5, wherein the initial current pulse portion of each of the plurality of routine charging instances has a duration selected to avoid any significant increase in a temperature of the battery during the initial current pulse portion.

10. The computer-implemented method of claim 5, comprising determining that the estimated condition of the battery is indicative of the battery needing to be replaced.

11. The computer-implemented method of claim 5, wherein the initial current pulse portion has a duration of less than 3 seconds.

12. The computer-implemented method of claim 5, wherein a temperature change during the current pulse portion is less than 0.05 degrees C.

13. The computer-implemented method of claim 5, further comprising initiating each of the routine charging instances with the initial current pulse portion, and conducting a remainder of each of the routine charging instances at the target charging current.

* * * * *